(12) United States Patent
Kuniyoshi et al.

(10) Patent No.: US 10,505,064 B2
(45) Date of Patent: Dec. 10, 2019

(54) PHOTOVOLTAIC DEVICE

(71) Applicant: SHARP KABUSHIKI KAISHA, Sakai, Osaka (JP)

(72) Inventors: Tokuaki Kuniyoshi, Sakai (JP); Kenichi Higashi, Sakai (JP); Takeshi Kamikawa, Sakai (JP); Masatomi Harada, Sakai (JP); Toshihiko Sakai, Sakai (JP); Kazuya Tsujino, Sakai (JP); Liumin Zou, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 86 days.

(21) Appl. No.: 15/759,672

(22) PCT Filed: Aug. 30, 2016

(86) PCT No.: PCT/JP2016/075310
§ 371 (c)(1),
(2) Date: Mar. 13, 2018

(87) PCT Pub. No.: WO2017/047375
PCT Pub. Date: Mar. 23, 2017

(65) Prior Publication Data
US 2019/0044018 A1    Feb. 7, 2019

(30) Foreign Application Priority Data

Sep. 14, 2015 (JP) .................. 2015-180410

(51) Int. Cl.
*H01L 31/0224* (2006.01)
*H01L 31/0747* (2012.01)
(Continued)

(52) U.S. Cl.
CPC .... *H01L 31/0747* (2013.01); *H01L 31/02363* (2013.01); *H01L 31/022425* (2013.01);
(Continued)

(58) Field of Classification Search
CPC .............................................. H01L 31/022441
See application file for complete search history.

(56) References Cited

U.S. PATENT DOCUMENTS

| | | | |
|---|---|---|---|
| 2010/0078069 A1 | 4/2010 | Ide | |
| 2014/0370651 A1 | 12/2014 | Tochihara et al. | |
| 2015/0144183 A1* | 5/2015 | Yang | H01L 21/266 |
| | | | 136/252 |

FOREIGN PATENT DOCUMENTS

| | | |
|---|---|---|
| JP | 2010-080888 A | 4/2010 |
| WO | 2011/149021 A1 | 12/2011 |
| WO | 2013/133005 A1 | 9/2013 |

* cited by examiner

*Primary Examiner* — Magali P Slawski
(74) *Attorney, Agent, or Firm* — ScienBiziP, P.C.

(57) ABSTRACT

A photovoltaic device and a photovoltaic module are provided that suppressing diffusion of boron and thereby improving conversion efficiency.

A photovoltaic device 10 includes: a semiconductor substrate 1; an intrinsic amorphous semiconductor layer 3 provided on the semiconductor substrate 1; n-type amorphous semiconductor strips 4 containing phosphorus as a dopant; and p-type amorphous semiconductor strips 5 containing boron as a dopant, the n- and p-type amorphous semiconductor strips 4 and 5 being provided alternately on the intrinsic amorphous semiconductor layer 3 as viewed along an in-plane direction. Each n-type amorphous semiconductor strip 4 includes a reduced-thickness region TD(n) on a face thereof adjacent to one of the p-type amorphous semiconductor strips 5. Each p-type amorphous semiconductor strip 5 includes a reduced-thickness region TD(p) on a face thereof adjacent to one of the n-type amorphous semiconductor strips 4. The reduced-thickness region TD(p) of the p-type amorphous semiconductor strip 5 has a steeper (Continued)

angle of inclination than does the reduced-thickness region TD(n) of the n-type amorphous semiconductor strip 4.

8 Claims, 32 Drawing Sheets

(51) Int. Cl.
    *H01L 31/0236*     (2006.01)
    *H01L 31/075*     (2012.01)
    *H01L 31/0352*     (2006.01)

(52) U.S. Cl.
    CPC ................ *H01L 31/022441* (2013.01); *H01L 31/035272* (2013.01); *H01L 31/075* (2013.01); *Y02E 10/50* (2013.01)

(a)

(b)

(c)

(a)

(b)

PHOTOVOLTAIC DEVICE

TECHNICAL FIELD

The present invention relates to photovoltaic devices.

BACKGROUND ART

Some conventional photovoltaic units have intrinsic (i-type) amorphous silicon interposed between an n-type crystalline silicon substrate and a p-type amorphous silicon layer. The structure reduces defects at the interface, thereby improving heterojunction interface properties of such devices. These types of photovoltaic units are called heterojunction solar cells.

PCT International Application Publication, No. WO2013/133005 discloses a heterojunction solar cell in which there are provided: n-type amorphous semiconductor strips and p-type amorphous semiconductor strips on a back face, which is opposite a light-receiving face; and n-electrodes and p-electrodes respectively on the n-type amorphous semiconductor strips and the p-type amorphous semiconductor strips (hereinafter, will be referred to as a "back face heterojunction solar cell").

SUMMARY OF INVENTION

In the fabrication of a back face heterojunction solar cell, the n- and p-type amorphous semiconductor strips are in some cases formed on an intrinsic amorphous semiconductor layer by chemical vapor deposition using a shadow mask such as a metal mask. Boron, used as a dopant when the p-type amorphous semiconductor strips are formed, can easily flow below non-opening portions of the shadow mask, hence diffusing into gap regions between the n-type amorphous semiconductor strips and the p-type amorphous semiconductor strips. The boron diffused into the gap regions attracts hydrogen atoms on the dangling bonds of the intrinsic amorphous semiconductor layer, which compromises passivation and lowers photoelectric conversion efficiency.

The present invention provides a photovoltaic device, capable of suppressing diffusion of boron and thereby improving conversion efficiency.

The present invention, in an aspect thereof, is directed to a photovoltaic device including: a semiconductor substrate; n-type amorphous semiconductor strips containing phosphorus as a dopant; and p-type amorphous semiconductor strips containing boron as a dopant, the n- and p-type amorphous semiconductor strips being provided alternately on the semiconductor substrate as viewed along an in-plane direction of the semiconductor substrate, wherein: each of the n-type amorphous semiconductor strips includes a reduced-thickness region on a face thereof adjacent to one of the p-type amorphous semiconductor strips; each of the p-type amorphous semiconductor strips includes a reduced-thickness region on a face thereof adjacent to one of the n-type amorphous semiconductor strips; and the reduced-thickness region of the p-type amorphous semiconductor strip has a steeper angle of inclination than does the reduced-thickness region of the n-type amorphous semiconductor strip, where: a first point is a point at which a thin film formed on the semiconductor substrate has a maximum thickness; a second point is either a point at which a rate of decrease of the thickness of the thin film, as traced along an in-plane direction of the thin film, changes from a first rate of decrease to a second rate of decrease that is larger than the first rate of decrease or a point at which a rate of change of the thickness of the thin film, as traced along the in-plane direction of the thin film, changes sign from negative to positive; and the reduced-thickness region is a region from the first point to the second point as traced along the in-plane direction of the thin film.

The present invention, in an aspect thereof, suppresses diffusion of boron and thereby improves conversion efficiency.

Figure 1:
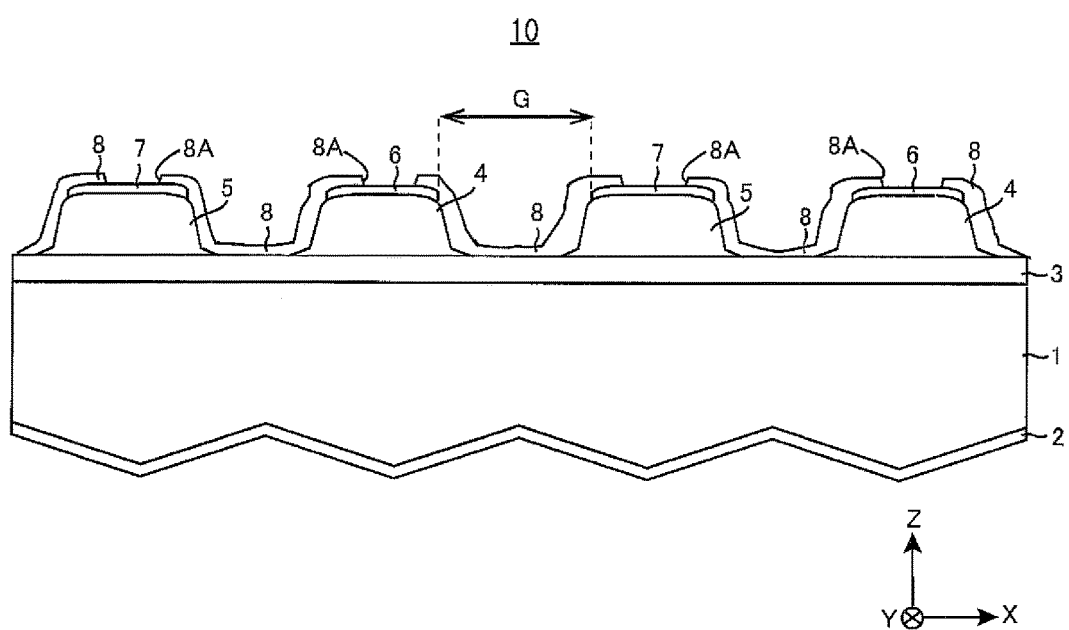
FIG. 1 is a cross-sectional view showing a structure of a photovoltaic device in accordance with Embodiment 1 of the present invention.
Figure 2:
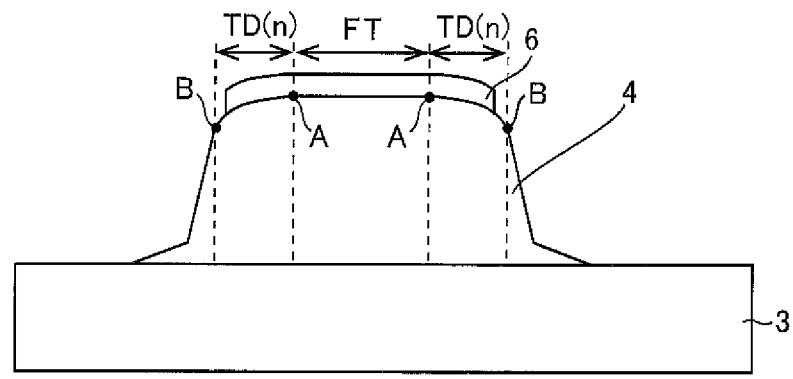
Figure 2:
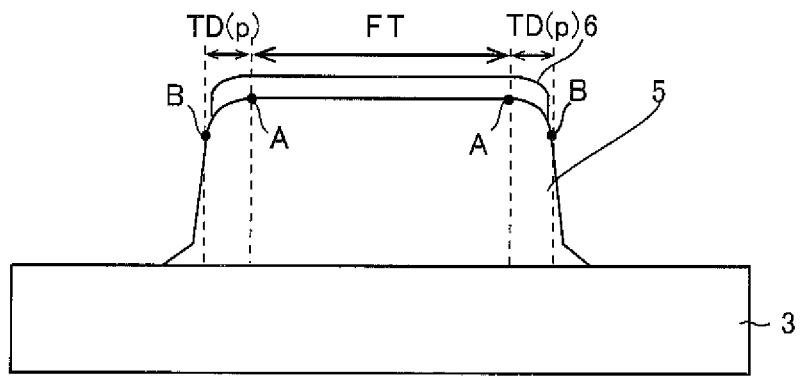

Portion (a) of FIG. 2 is a detailed cross-sectional view showing a structure of an n-type amorphous semiconductor strip shown in FIG. 1, and (b) of FIG. 2 is a detailed cross-sectional view of a structure of a p-type amorphous semiconductor strip shown in FIG. 1.

Figure 3:
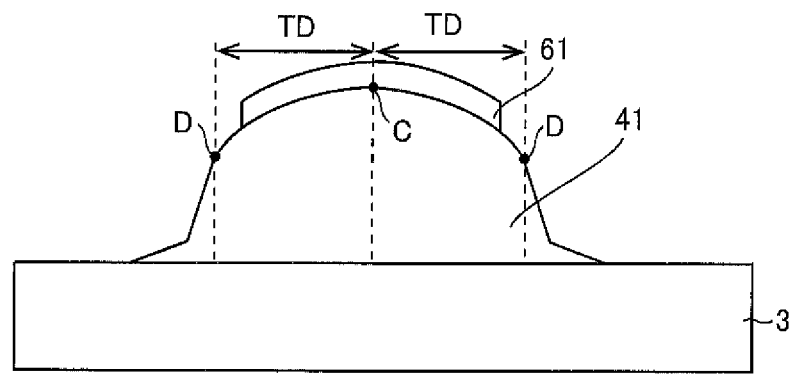
Figure 3:
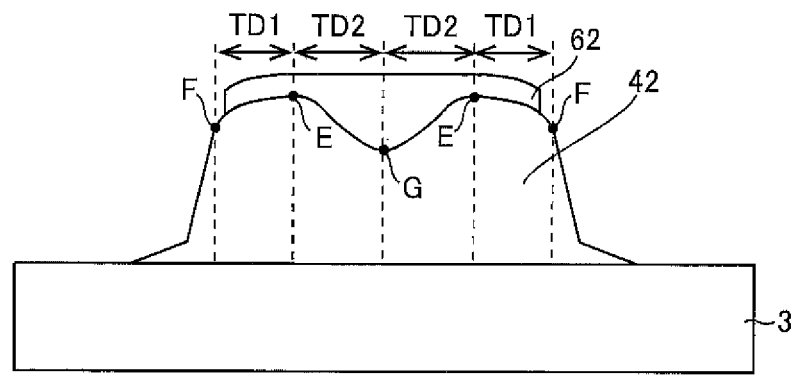

FIG. 3 contains detailed cross-sectional views showing other structures for the n-type amorphous semiconductor strip shown in FIG. 1.

Figure 4:
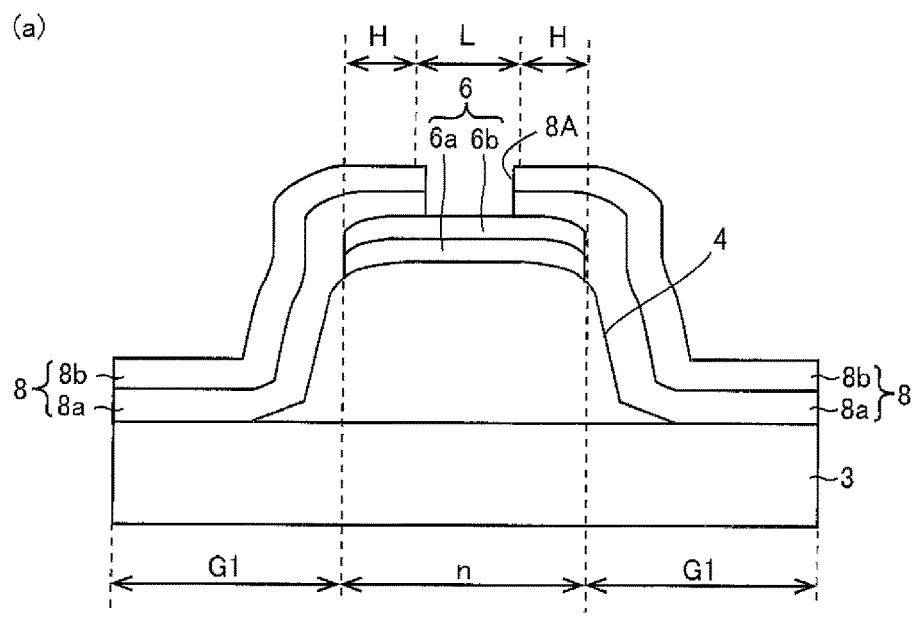
Figure 4:
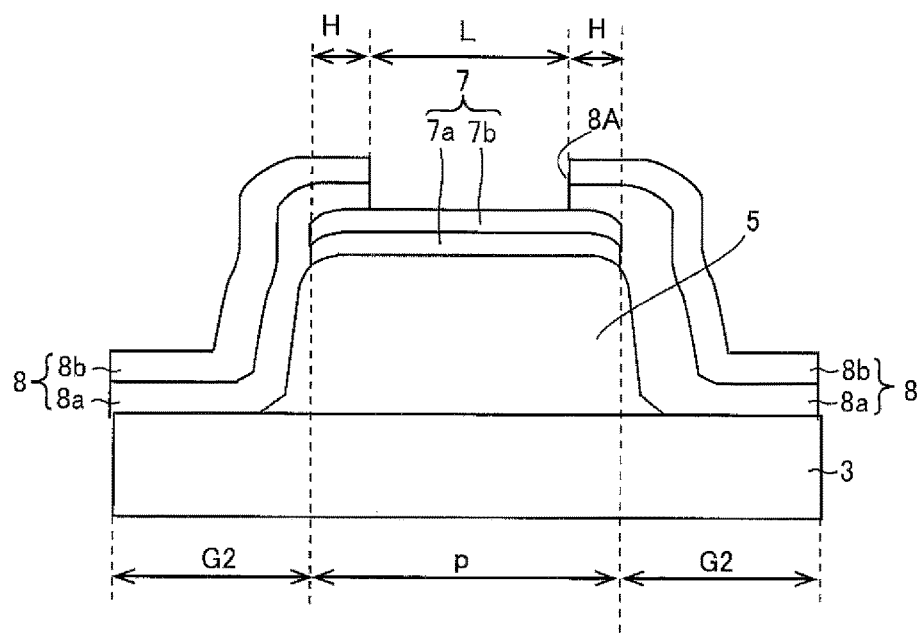

Portion (a) of FIG. 4 is an enlarged view of an electrode and a protective film formed on the n-type amorphous semiconductor strip shown in FIG. 1, and (b) of FIG. 4 is an enlarged view of an electrode and a protective film formed on the p-type amorphous semiconductor strip shown in FIG. 1.

Figure 5:
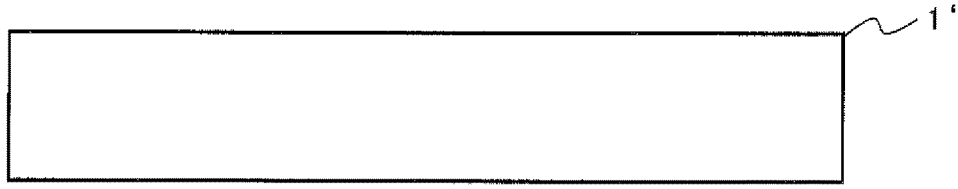
Figure 5:
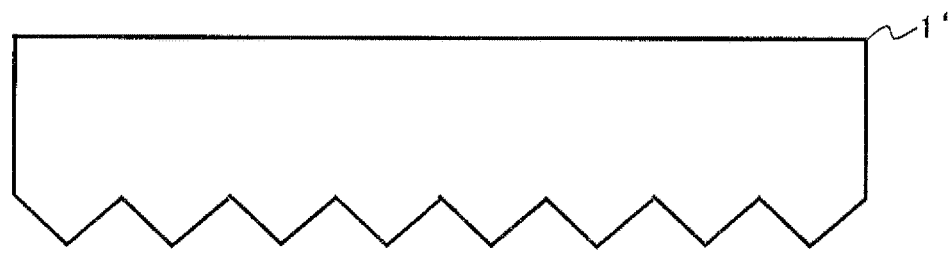
Figure 5:
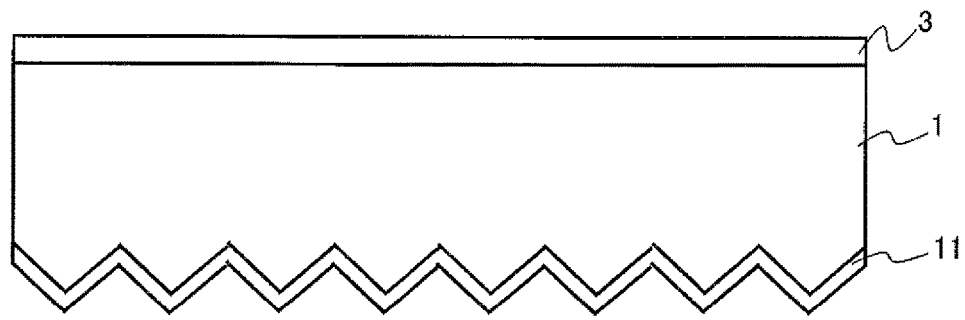

FIG. 5 is a first manufacturing step diagram illustrating a method of manufacturing the photovoltaic device shown in FIG. 1.

Figure 6:
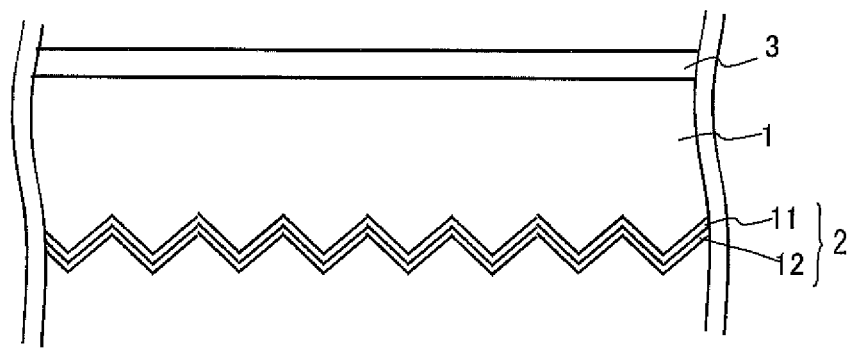
Figure 6:
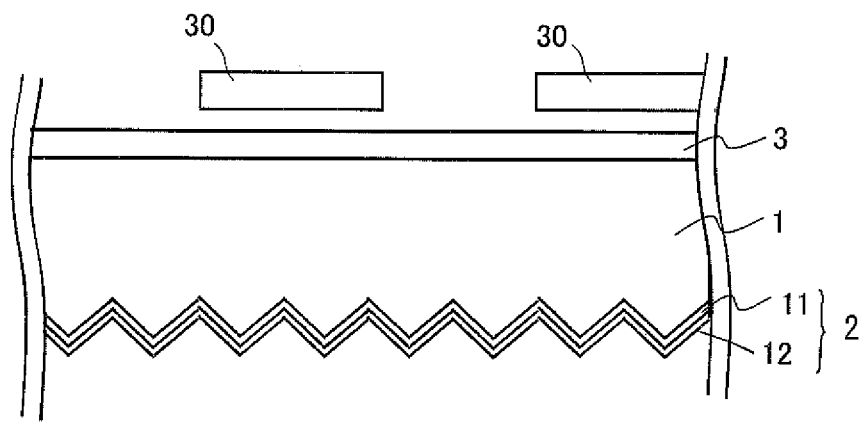
Figure 6:
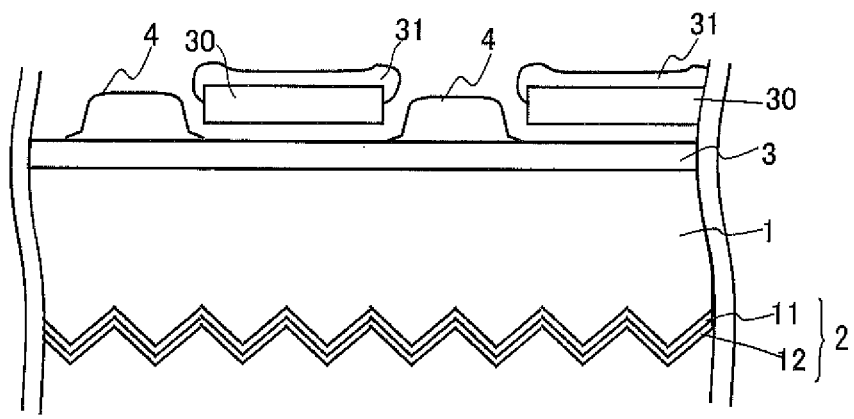

FIG. 6 is a second manufacturing step diagram illustrating a method of manufacturing the photovoltaic device shown in FIG. 1.

Figure 7:
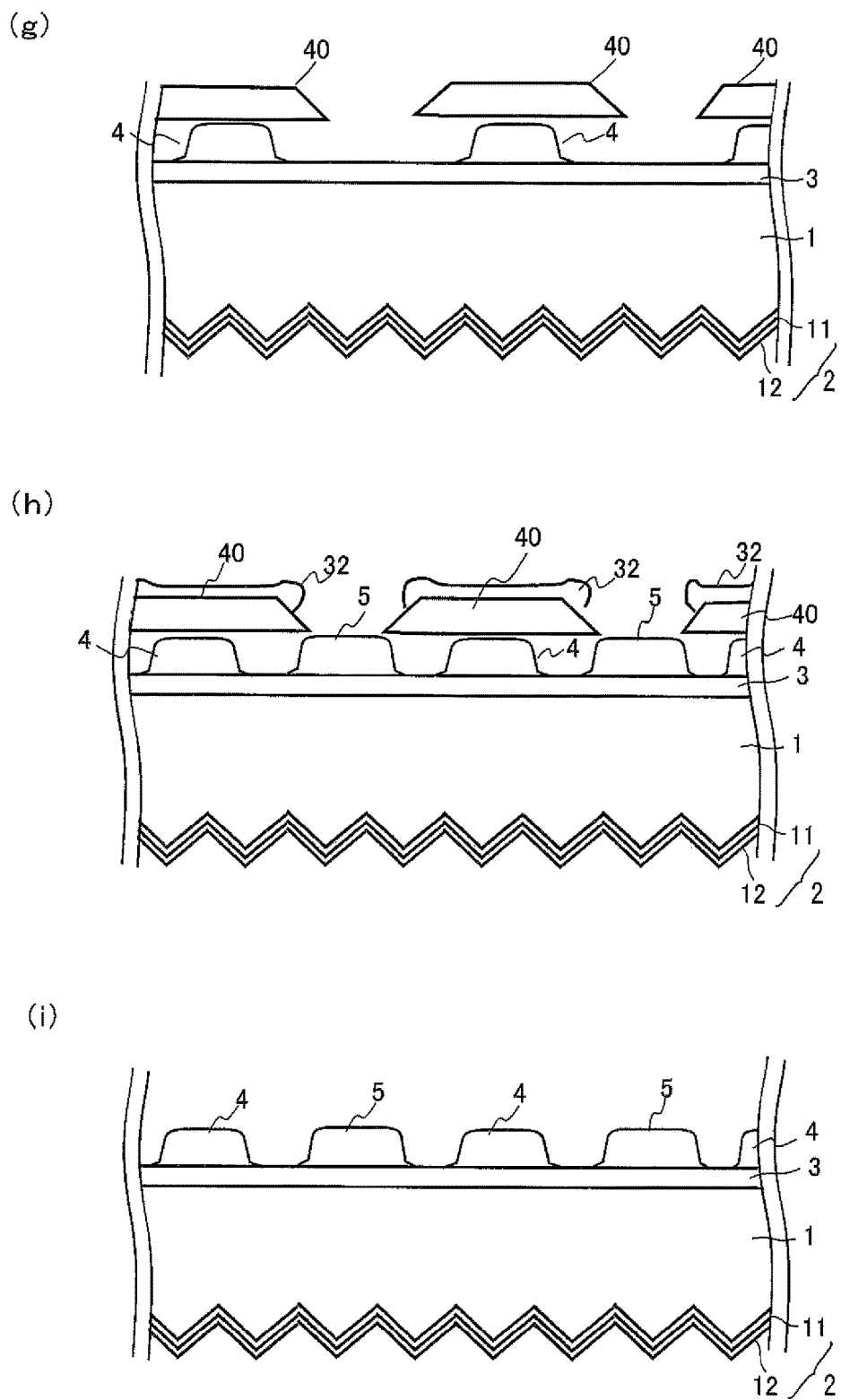

FIG. 7 is a third manufacturing step diagram illustrating a method of manufacturing the photovoltaic device shown in FIG. 1.

Figure 8:
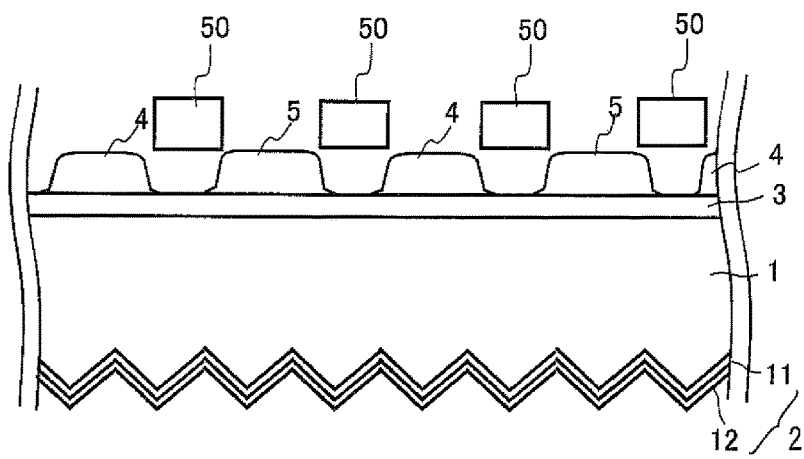
Figure 8:
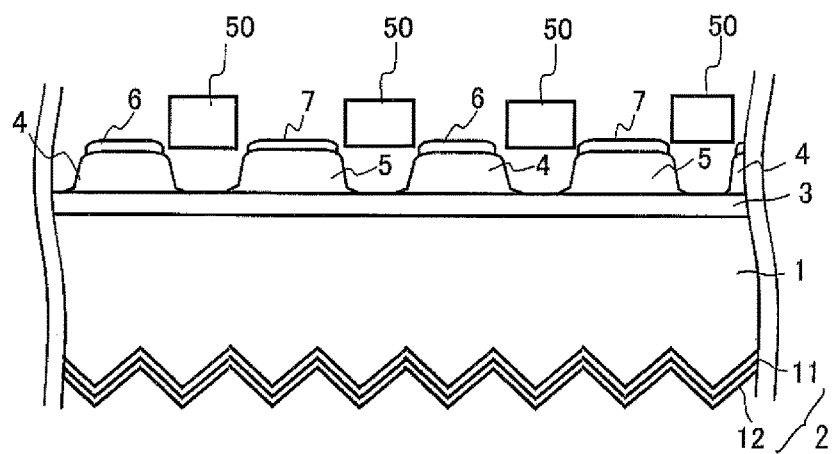
Figure 8:
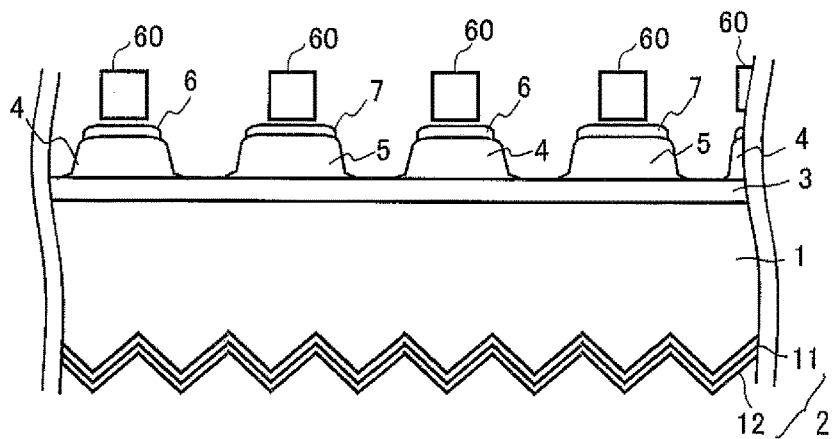

FIG. 8 is a fourth manufacturing step diagram illustrating a method of manufacturing the photovoltaic device shown in FIG. 1.

Figure 9:
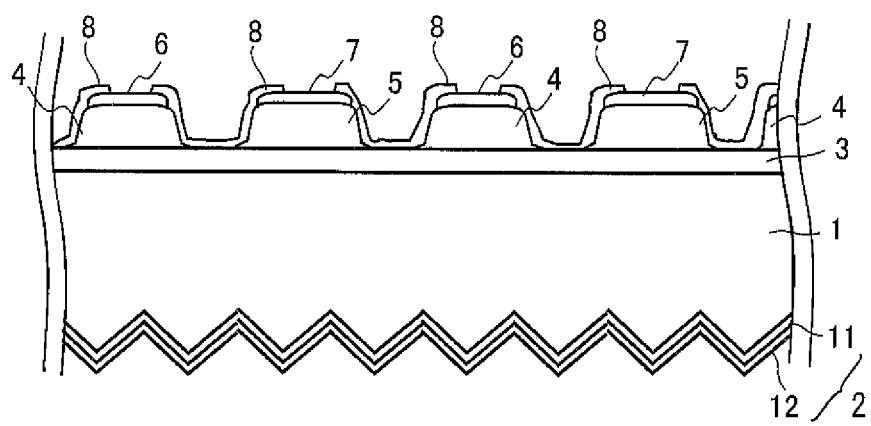

FIG. 9 is a fifth manufacturing step diagram illustrating a method of manufacturing the photovoltaic device shown in FIG. 1.

Figure 10:
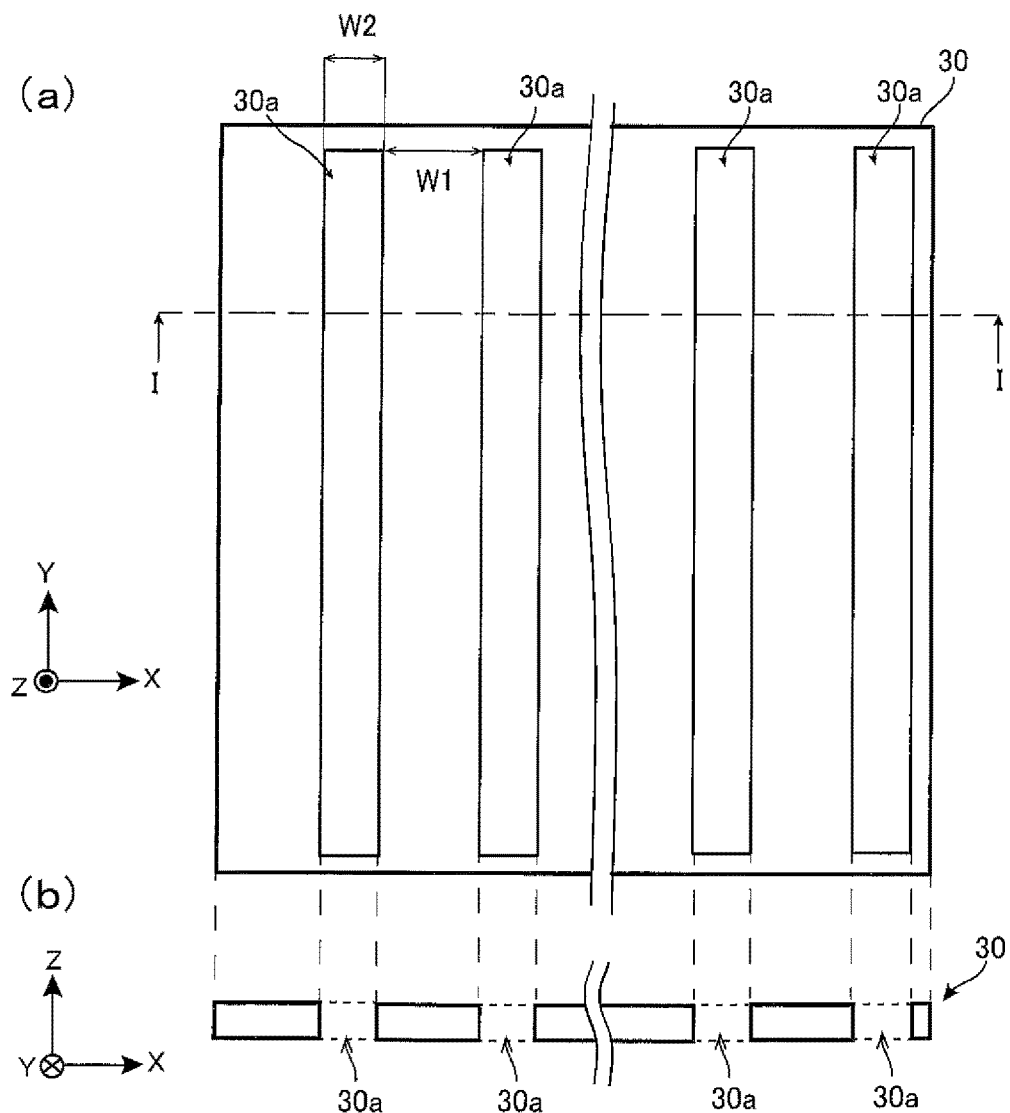

Portion (a) of FIG. 10 is a schematic plan view of a shadow mask used to form n-type amorphous semiconductor strips in accordance with Embodiment 1, and (b) of FIG. 10 is a cross-sectional view, taken along line I-I, of the shadow mask shown in (a) of FIG. 10.

Figure 11:
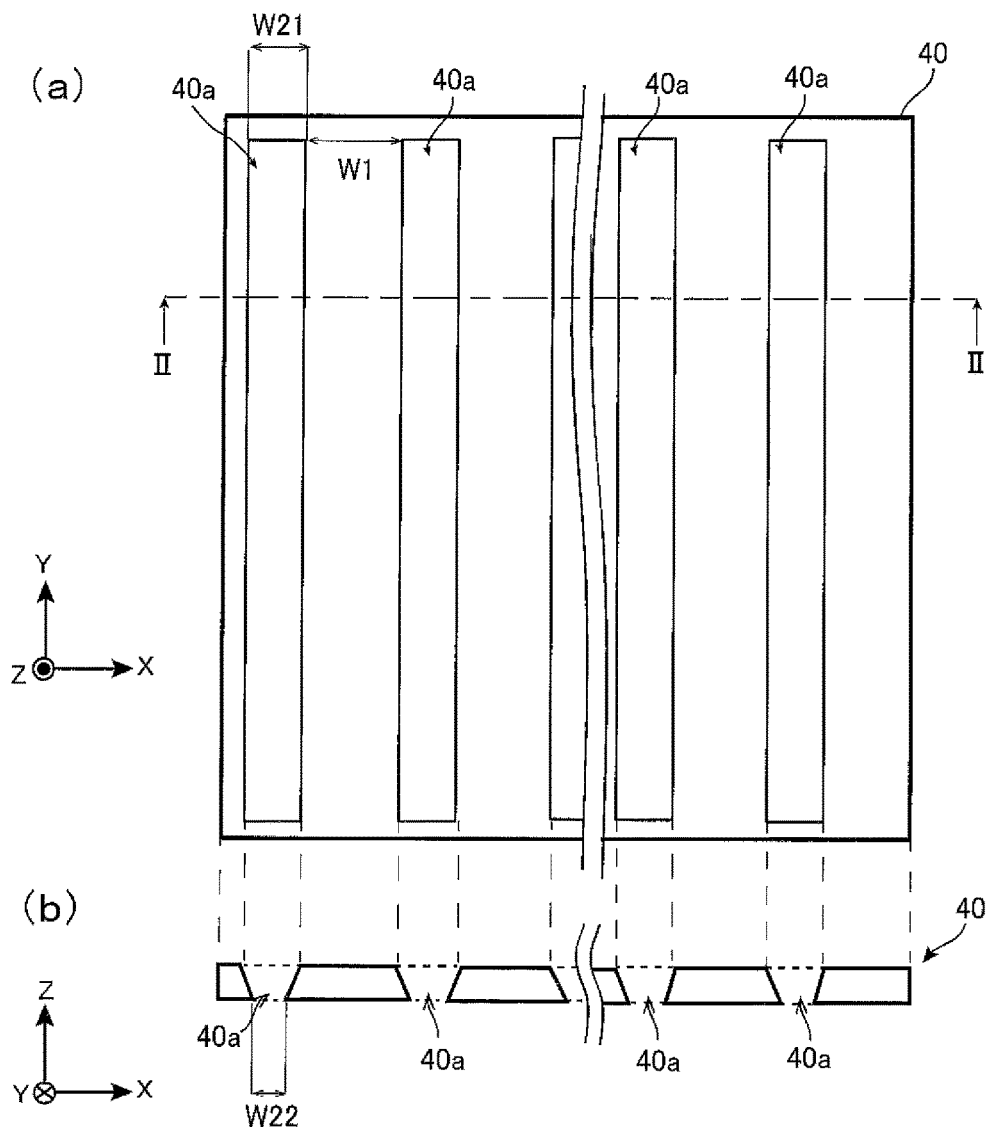

Portion (a) of FIG. 11 is a schematic plan view of a shadow mask used to form p-type amorphous semiconductor strips in accordance with Embodiment 1, and (b) of FIG. 11 is a cross-sectional view, taken along line II-II, of the shadow mask shown in (a) of FIG. 11.

Figure 12A:
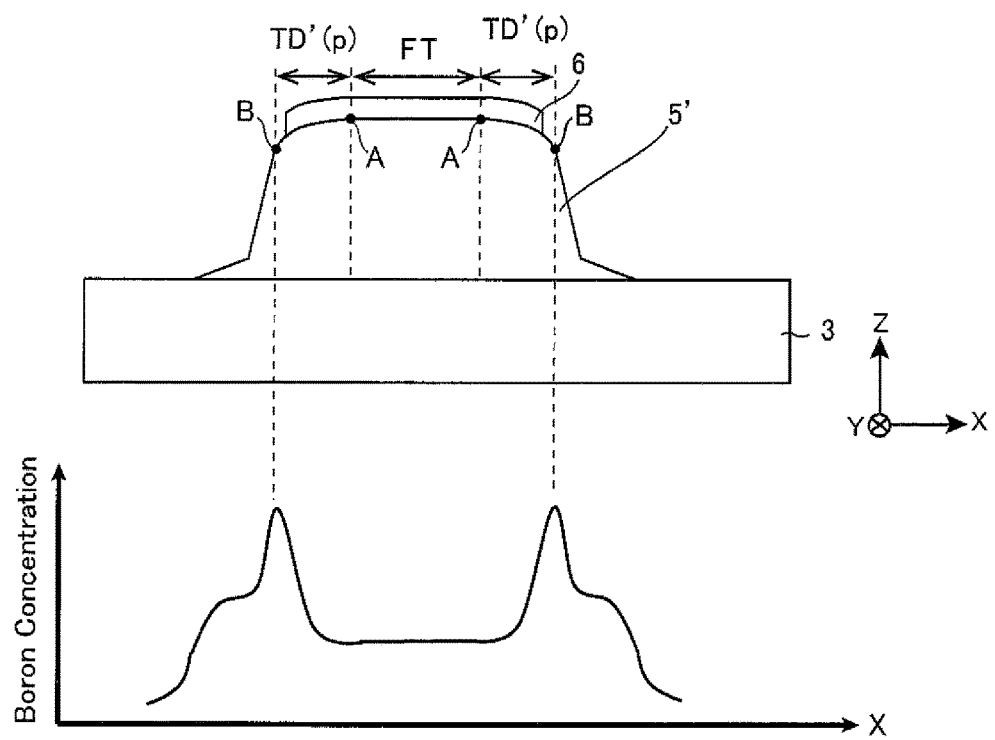

FIG. 12A is a diagram illustrating a p-type amorphous semiconductor strip having, in a reduced-thickness region thereof, an angle of inclination close to that of a reduced-thickness region of an n-type amorphous semiconductor strip and also representing boron concentration in the p-type amorphous semiconductor strip.

Figure 12B:
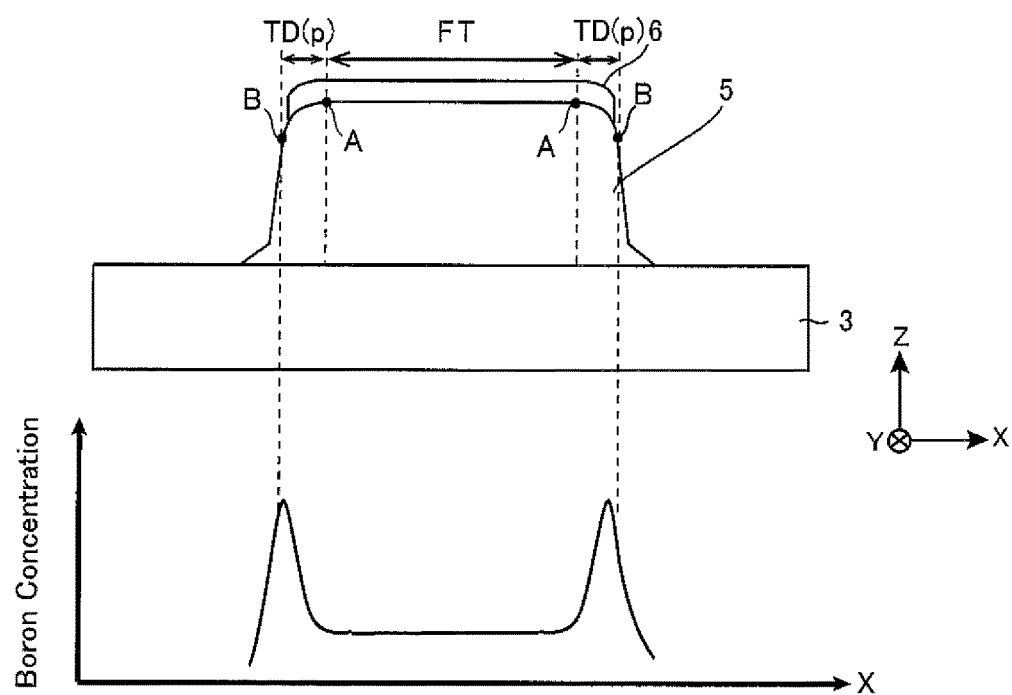

FIG. 12B is a diagram illustrating a p-type amorphous semiconductor strip in accordance with Embodiment 1 and also representing boron concentration in the p-type amorphous semiconductor strip.

Figure 13:
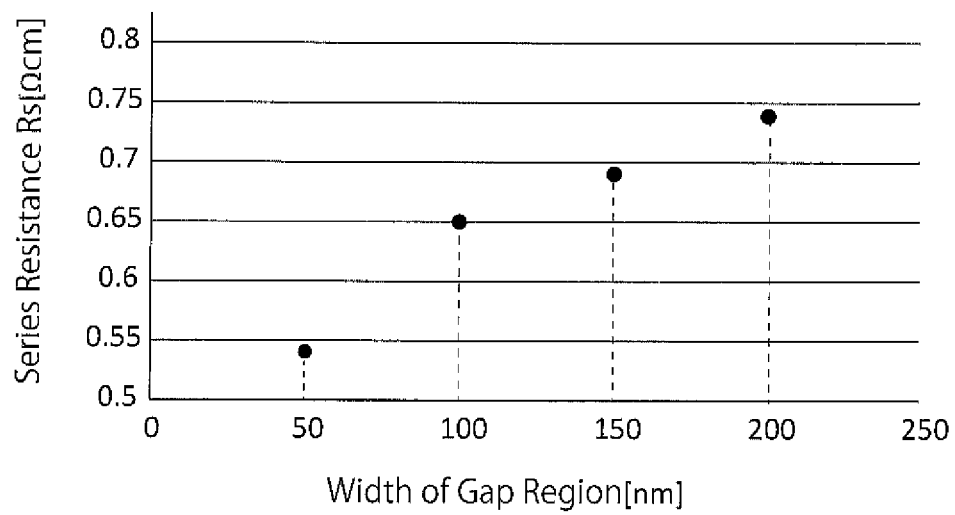

FIG. 13 is a diagram representing a relationship between the width of a gap region and the series resistance of a photovoltaic device.

Figure 14:
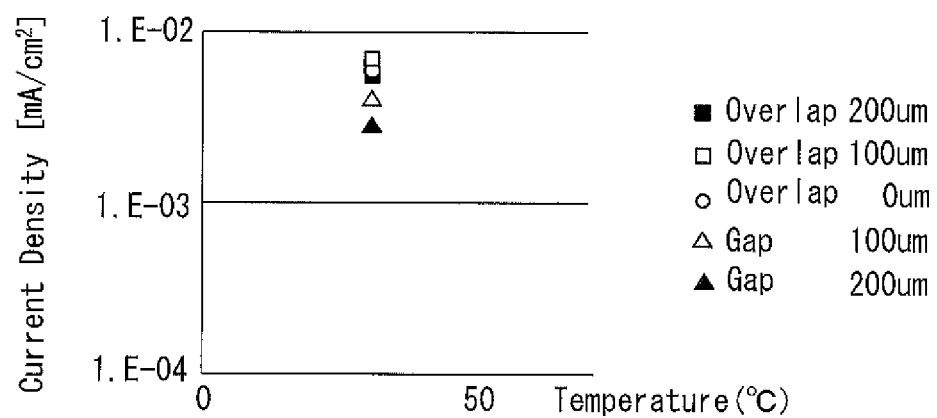

FIG. 14 is a diagram representing reverse current densities for overlapping n- and p-type amorphous semiconductor strips and non-overlapping n- and p-type amorphous semiconductor strips.

Figure 15:
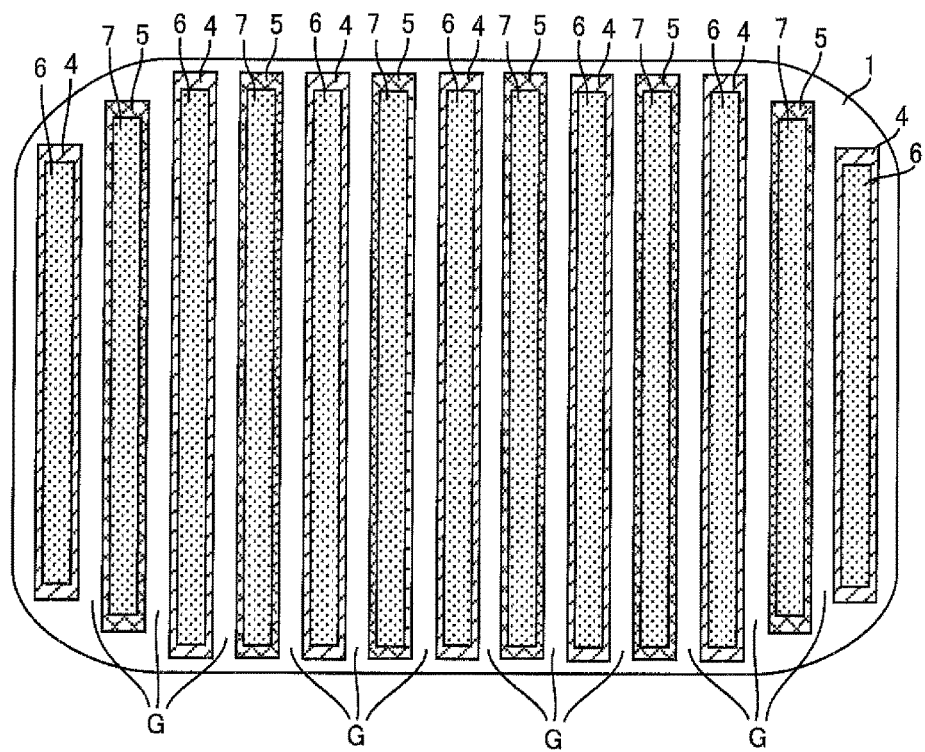
Figure 15:
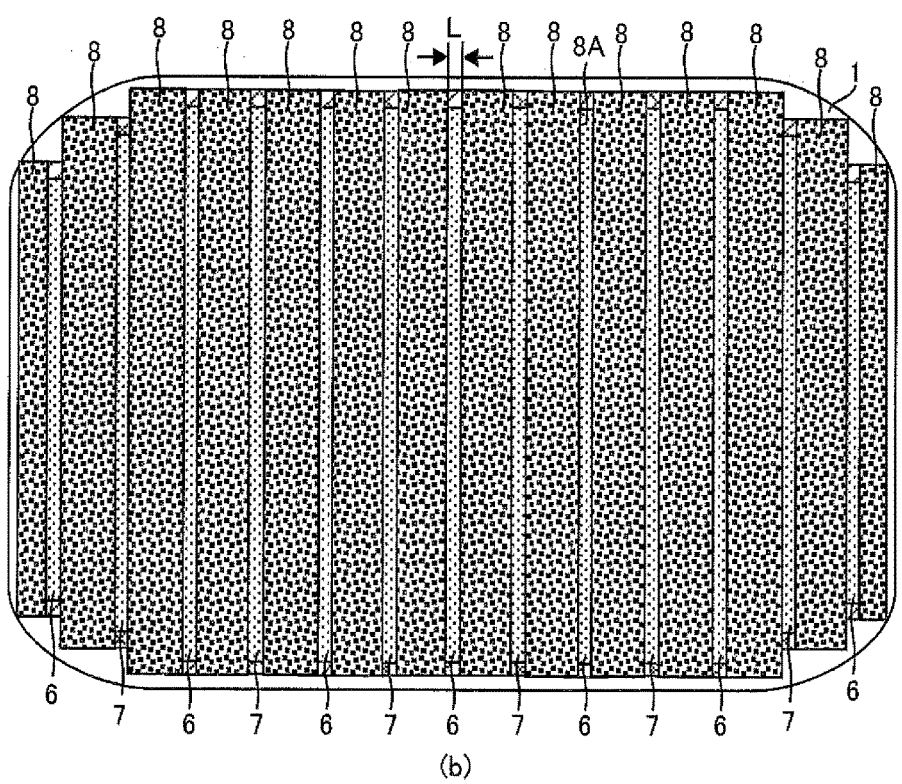

FIG. 15 contains plan views of the photovoltaic device shown in FIG. 1 as viewed from the back side thereof.

Figure 16:
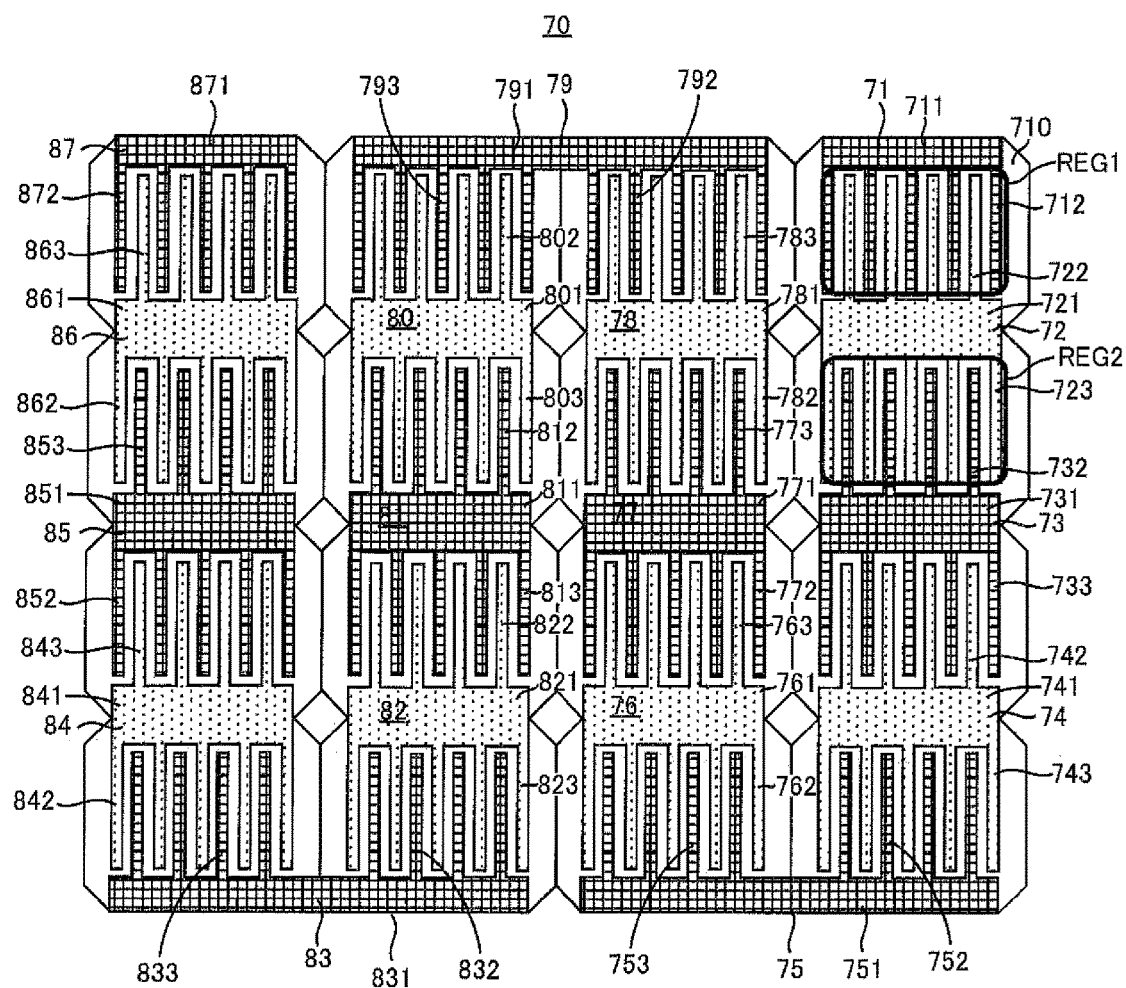

FIG. 16 is a plan view of a wiring sheet.

Figure 17:
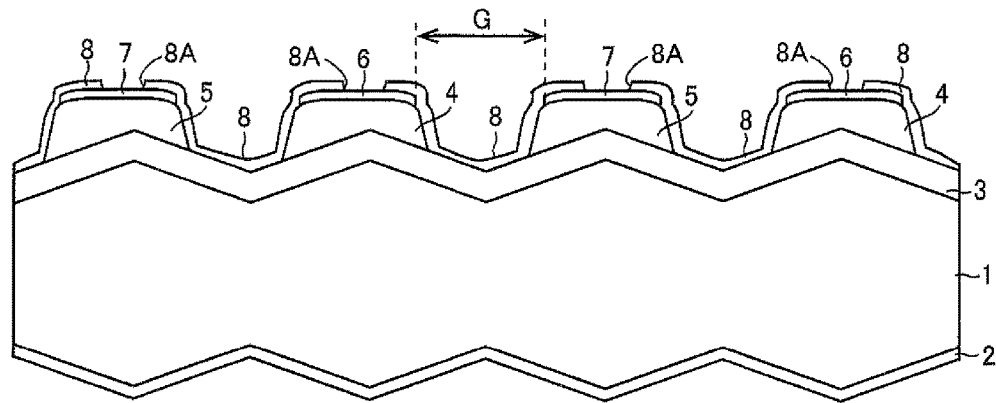

FIG. 17 is a cross-sectional view showing a structure of a photovoltaic device in accordance with Embodiment 2.

Figure 18:
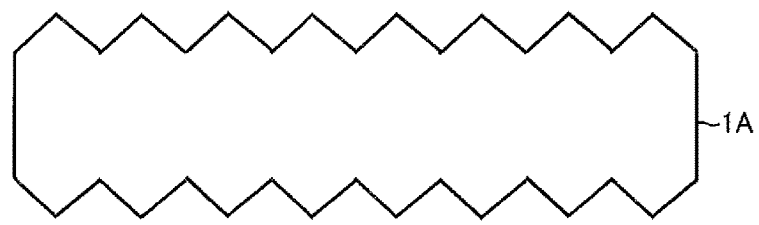
Figure 18:
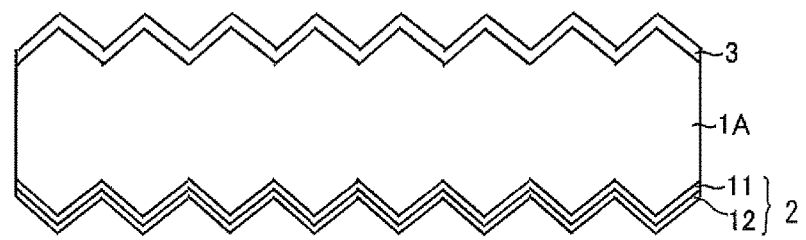

FIG. 18 is a diagram illustrating steps of manufacturing a semiconductor substrate in accordance with Embodiment 2.

Figure 19:
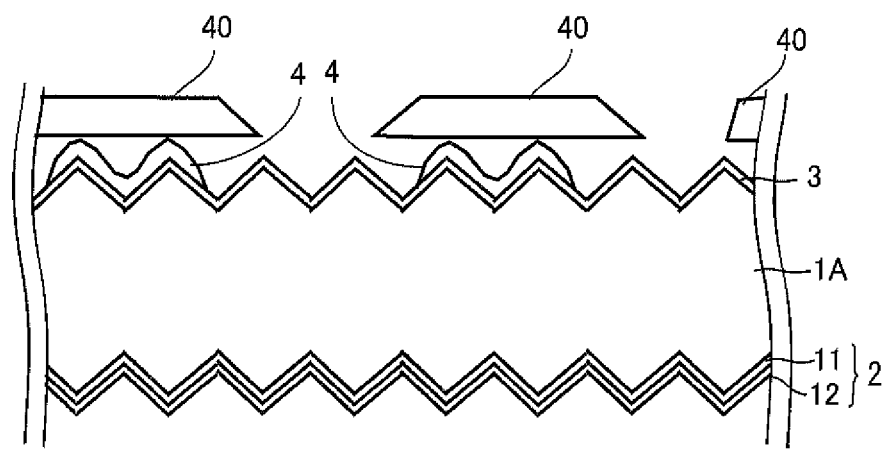

FIG. 19 is a diagram illustrating cavity regions between a textured semiconductor substrate and a shadow mask.

Figure 20:
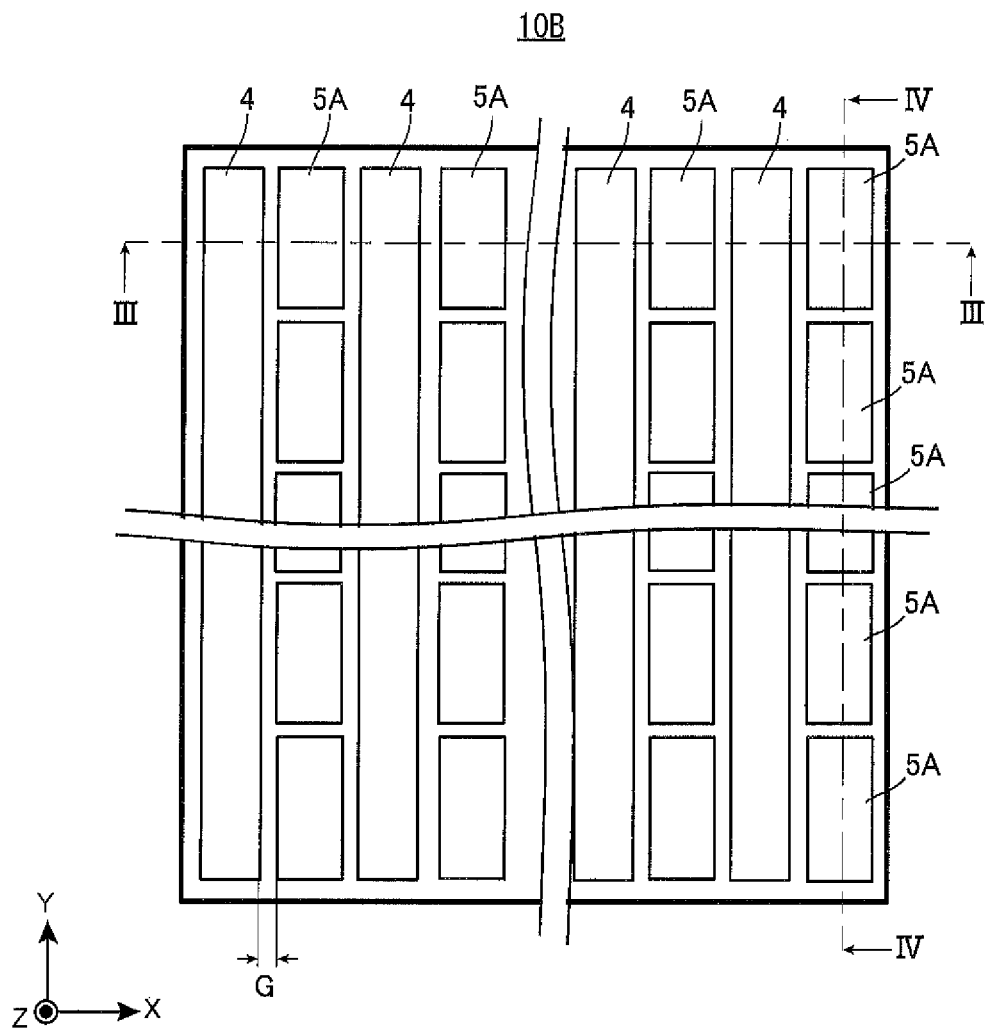

FIG. 20 is a schematic plan view of a photovoltaic device in accordance with Embodiment 3 as viewed from the back side thereof.

Figure 21A:
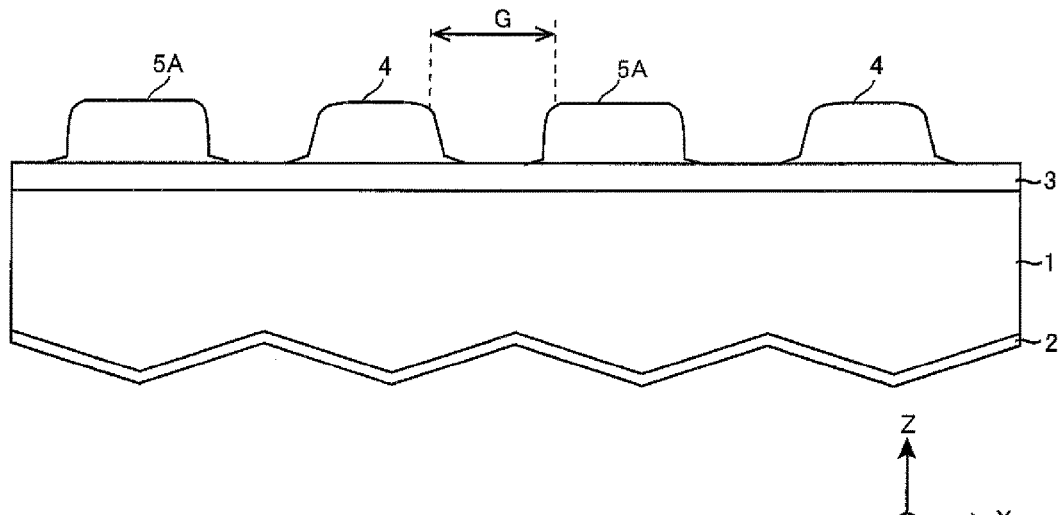

FIG. 21A is a cross-sectional view, taken along line III-III, of the photovoltaic device shown in FIG. 20.

Figure 21B:
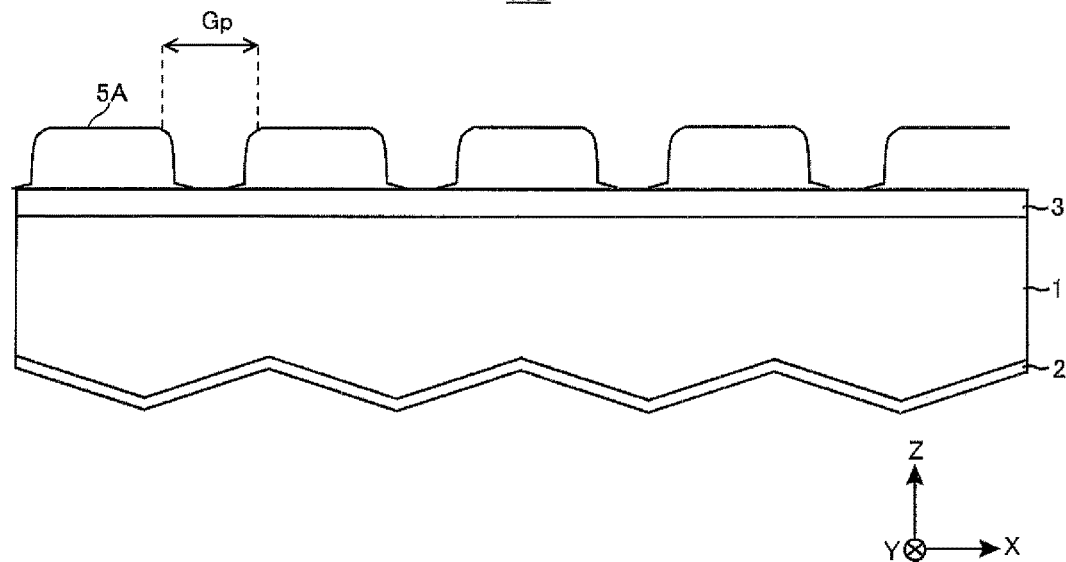

FIG. 21B is a cross-sectional view, taken along line IV-IV, of the photovoltaic device shown in FIG. 20.

Figure 22:
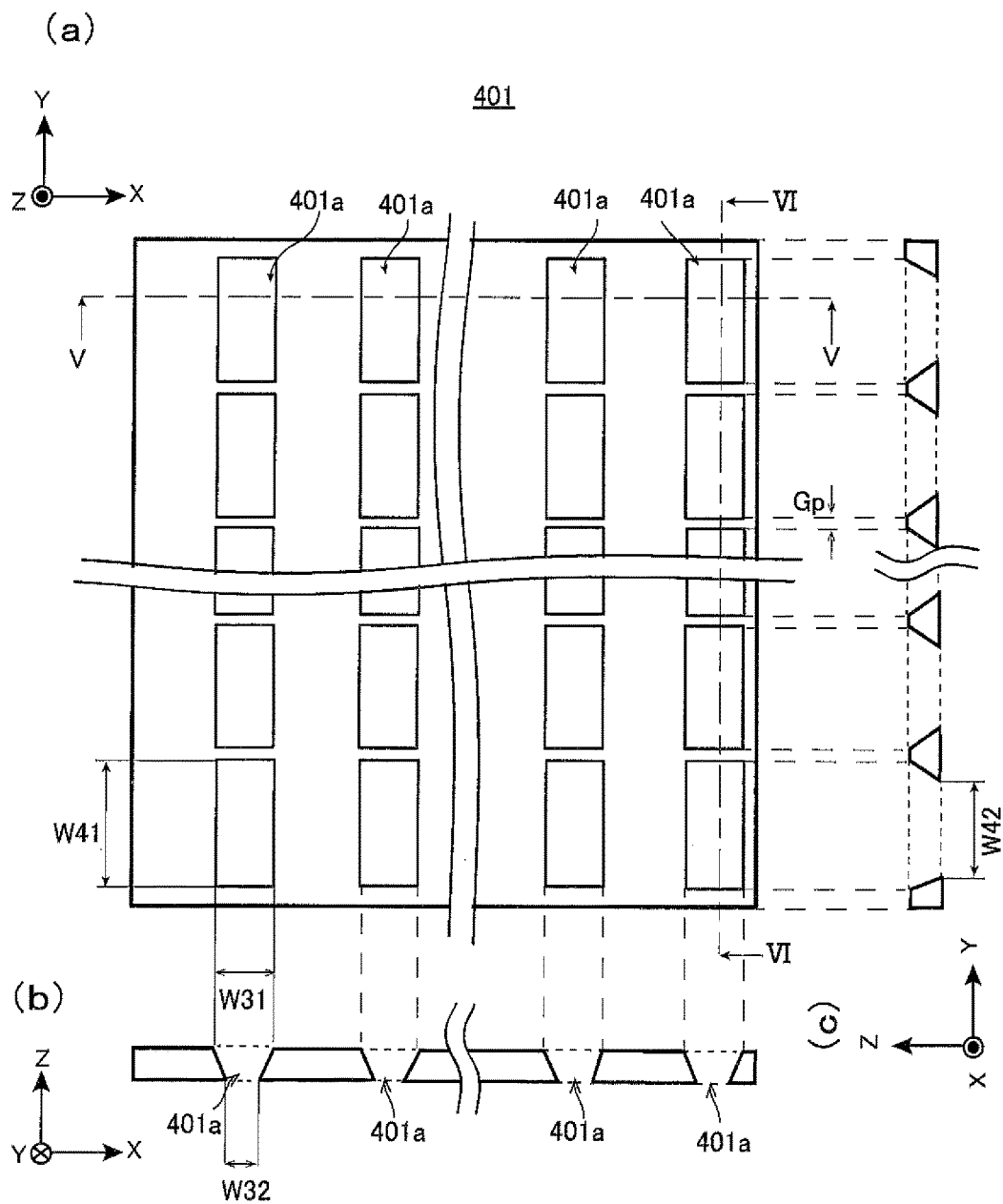

Portion (a) of FIG. 22 is a schematic plan view of a shadow mask used to form p-type amorphous semiconductor strips in accordance with Embodiment 3, (b) of FIG. 22 is a cross-sectional view, taken along line V-V, of the shadow mask shown in (a) of FIG. 22, and (c) of FIG. 22 is a cross-sectional view, taken along line VI-VI, of the shadow mask shown in (a) of FIG. 22.

Figure 23:
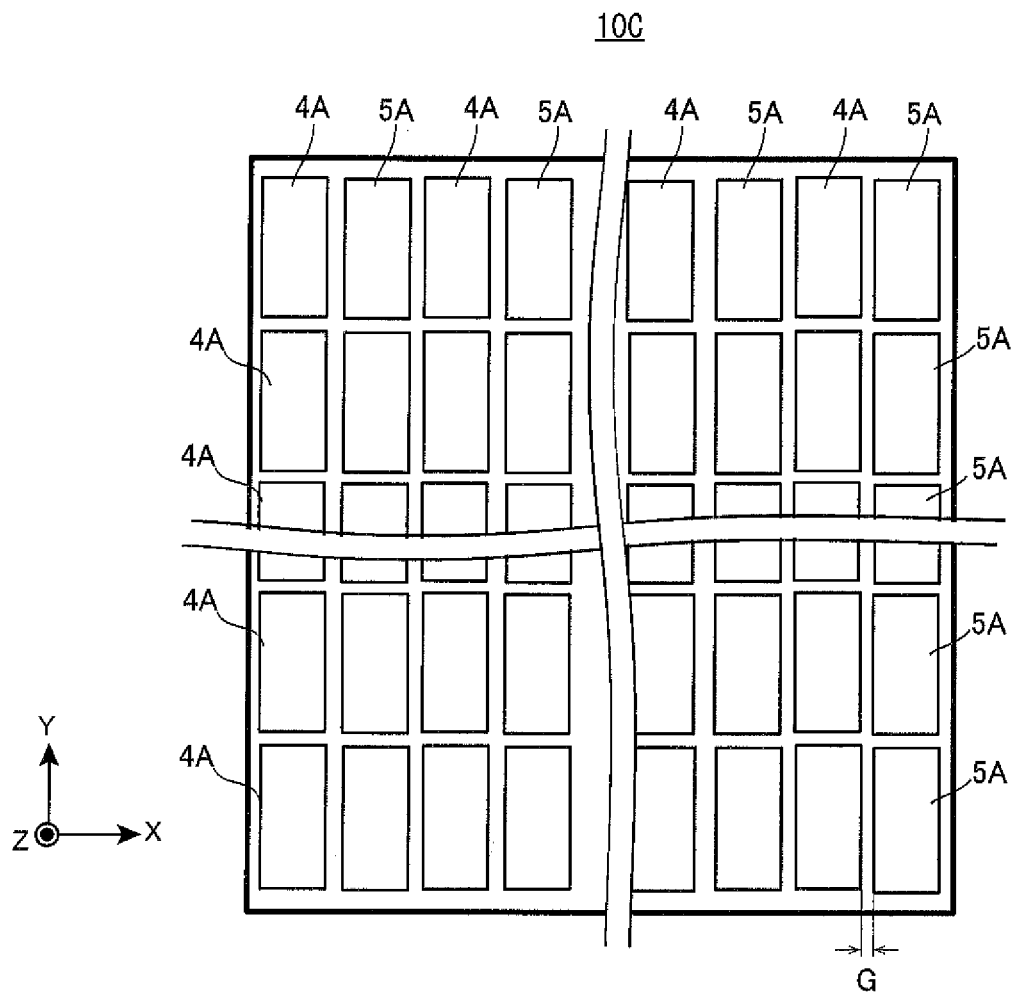

FIG. 23 is a schematic plan view of a photovoltaic device in accordance with Embodiment 4 as viewed from the back side thereof.

Figure 24:
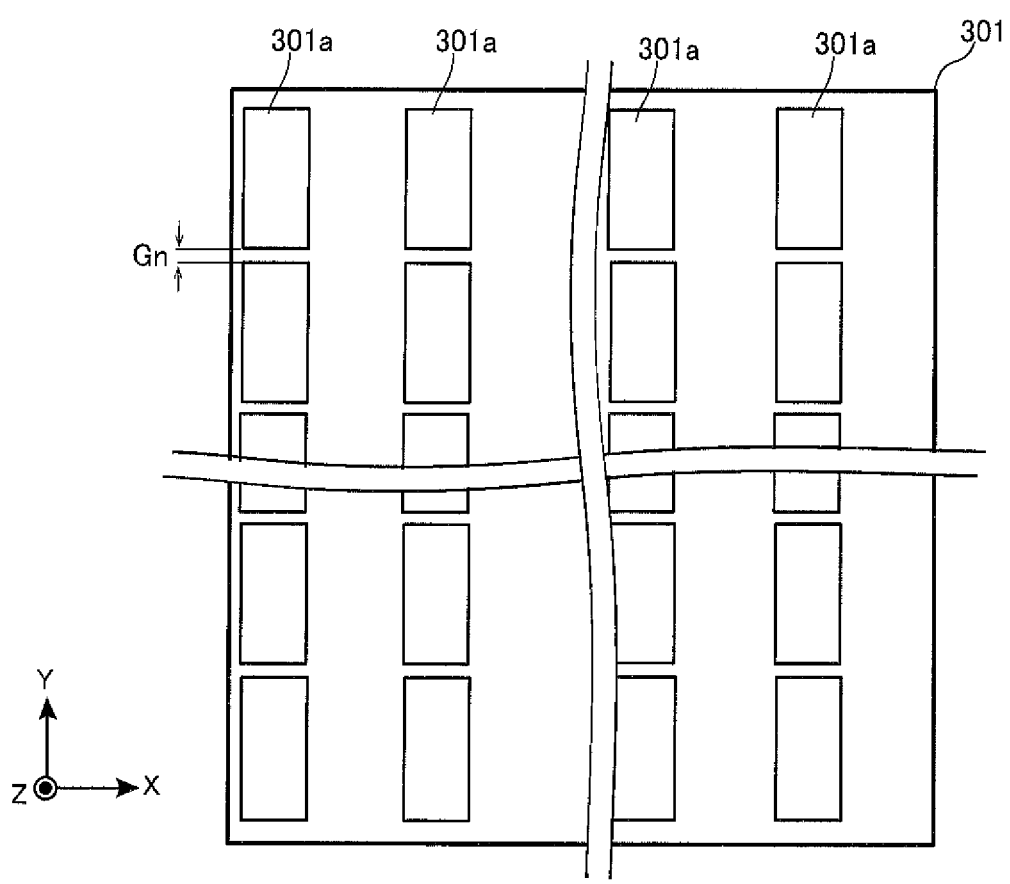

FIG. 24 is a schematic plan view of a shadow mask used to form n-type amorphous semiconductor strips in accordance with Embodiment 4.

Figure 25:
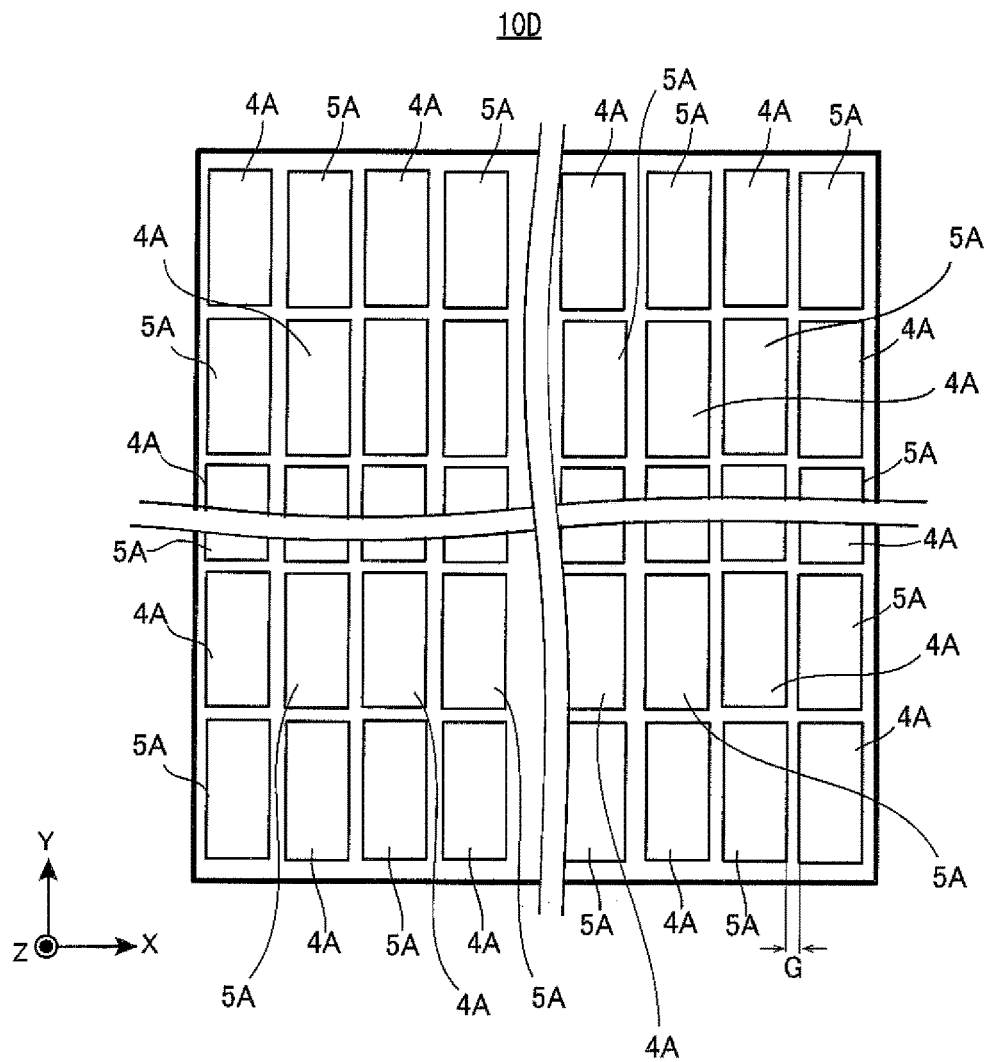

FIG. 25 is a schematic plan view of a photovoltaic device in accordance with Embodiment 5 as viewed from the back side thereof.

Figure 26A:
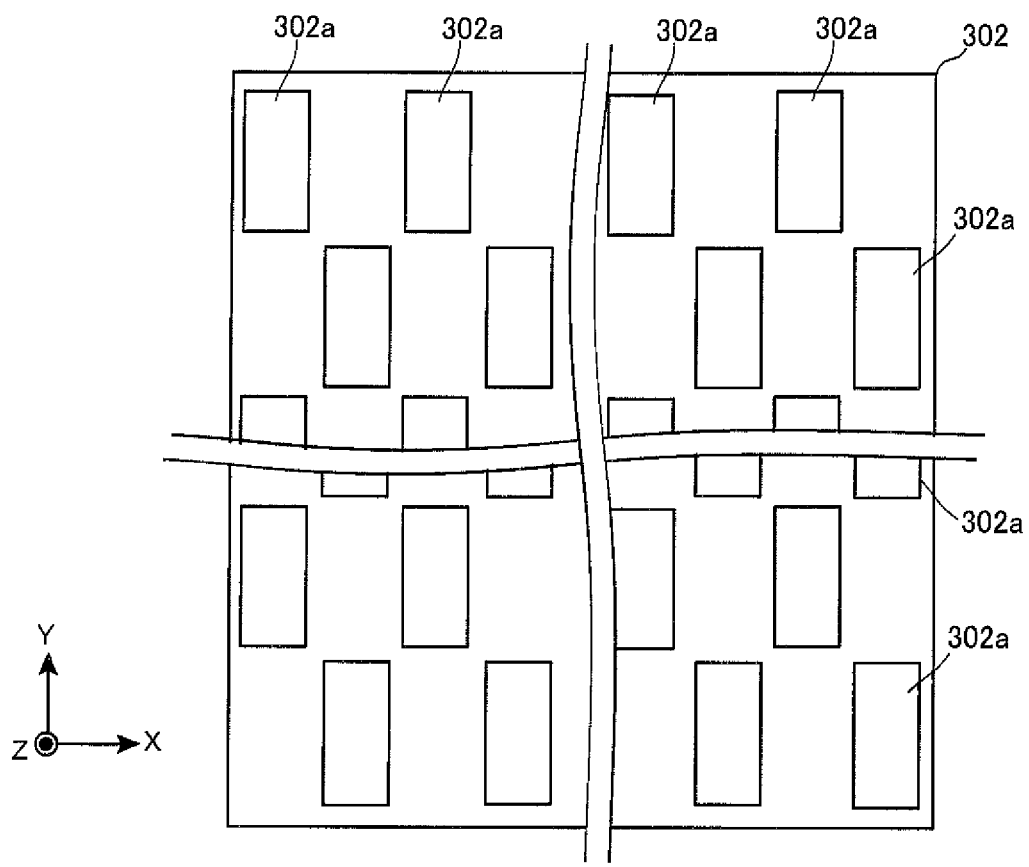

FIG. 26A is a schematic plan view of a shadow mask used to form the n-type amorphous semiconductor strips shown in FIG. 25.

Figure 26B:
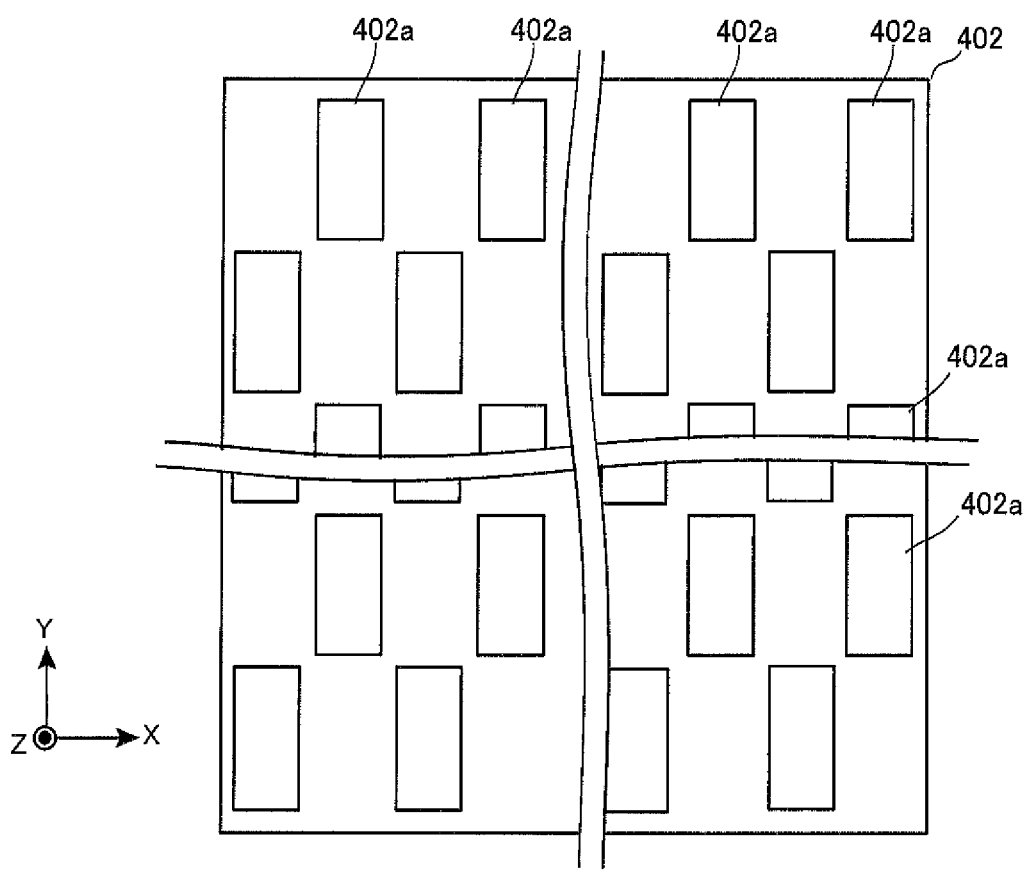

FIG. 26B is a schematic plan view of a shadow mask used to form the p-type amorphous semiconductor strips shown in FIG. 25.

Figure 27:
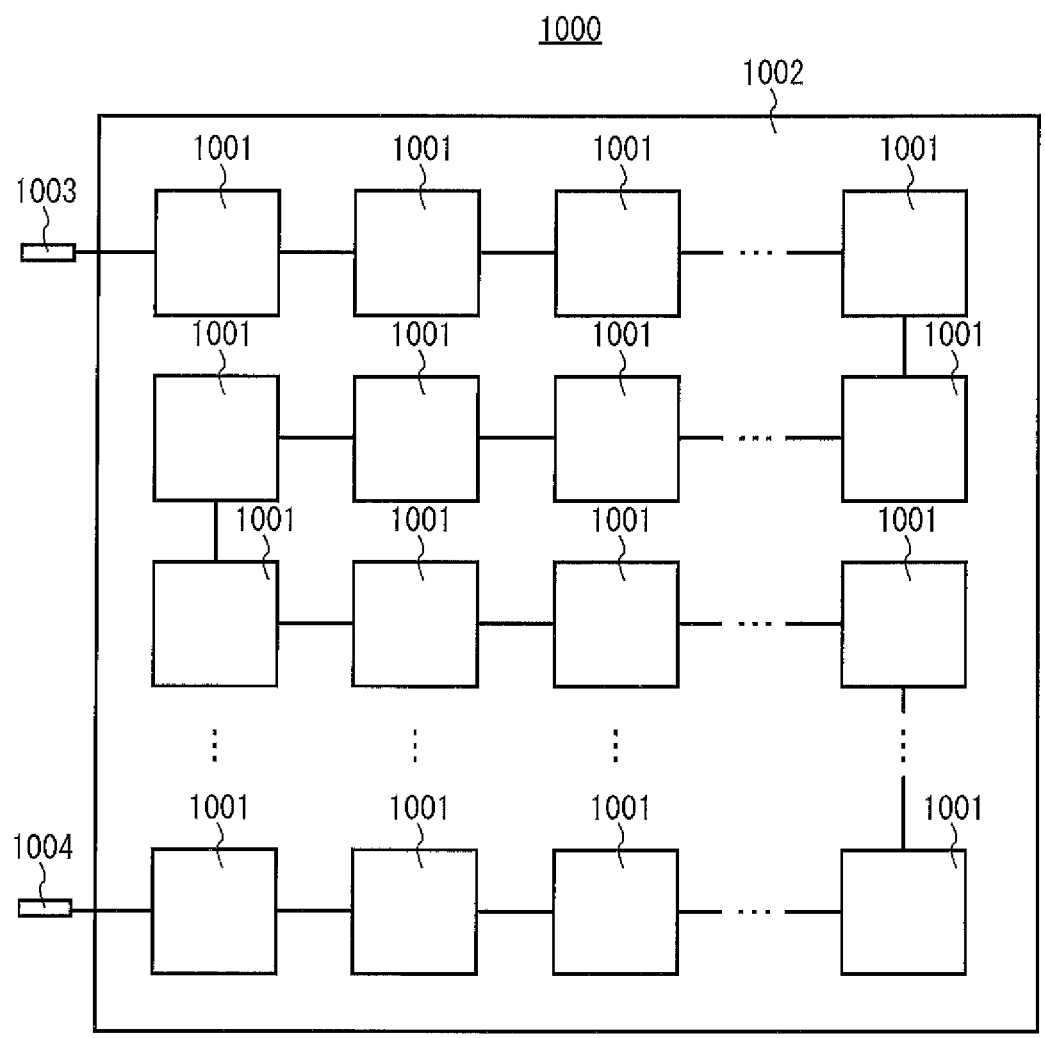

FIG. 27 is a schematic diagram showing a configuration of a photovoltaic module including photovoltaic devices in accordance with Embodiment 6.

Figure 28:
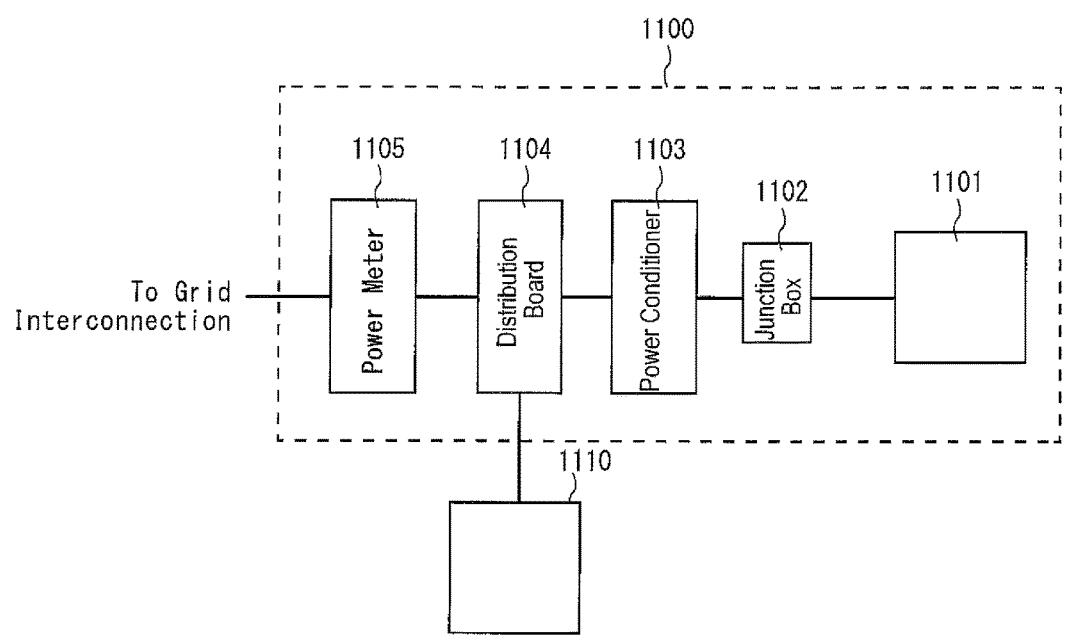

FIG. 28 is a schematic diagram showing a configuration of a solar power generation system including photovoltaic devices in accordance with Embodiment 7.

Figure 29:
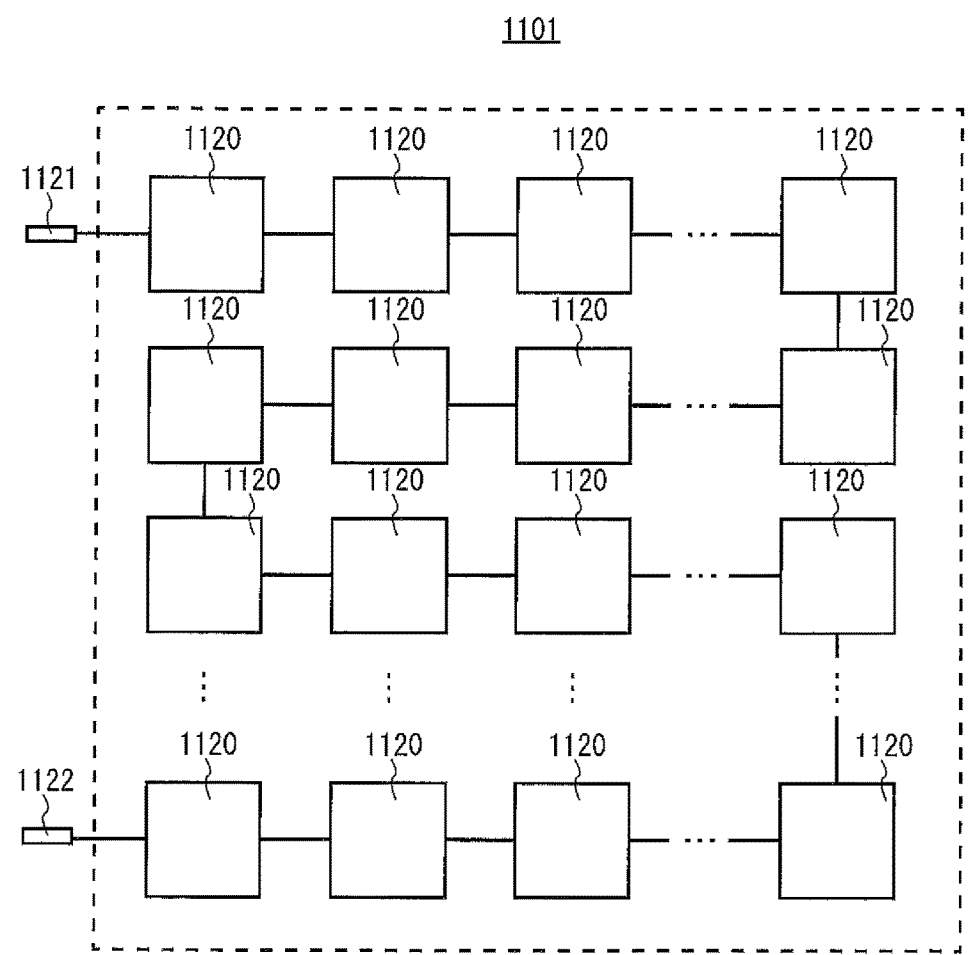

FIG. 29 is a schematic diagram showing a configuration of the photovoltaic module array shown in FIG. 28.

Figure 30:
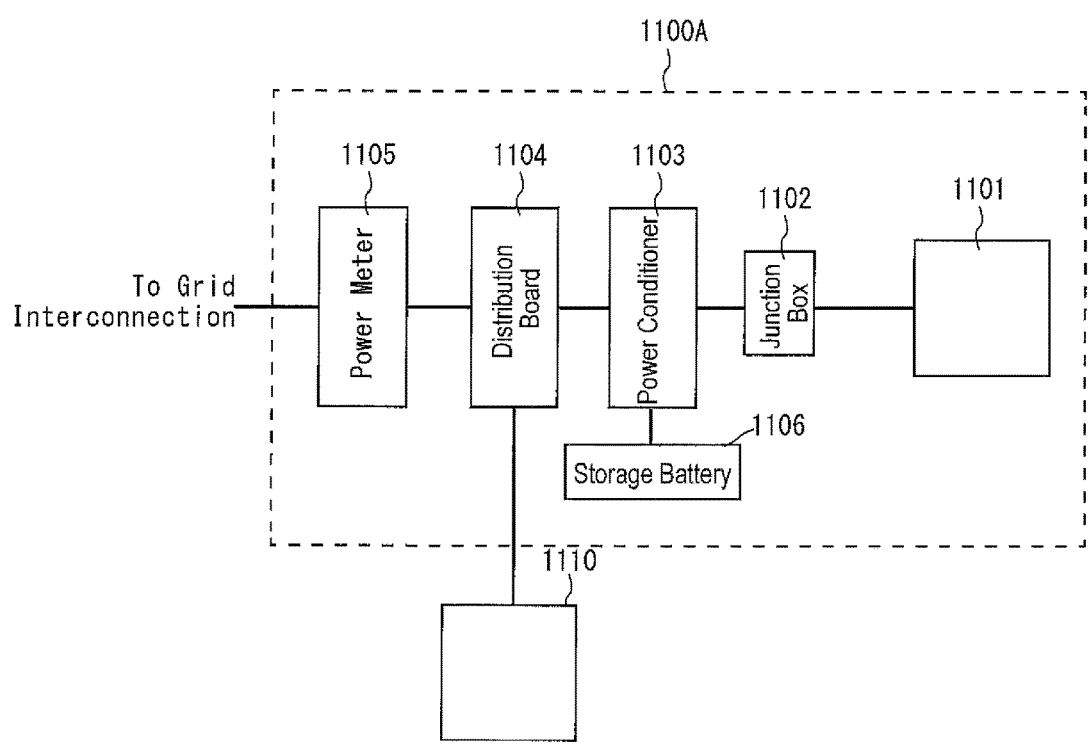

FIG. 30 is a schematic diagram showing a configuration of another solar power generation system including photovoltaic devices in accordance with Embodiment 7.

Figure 31:
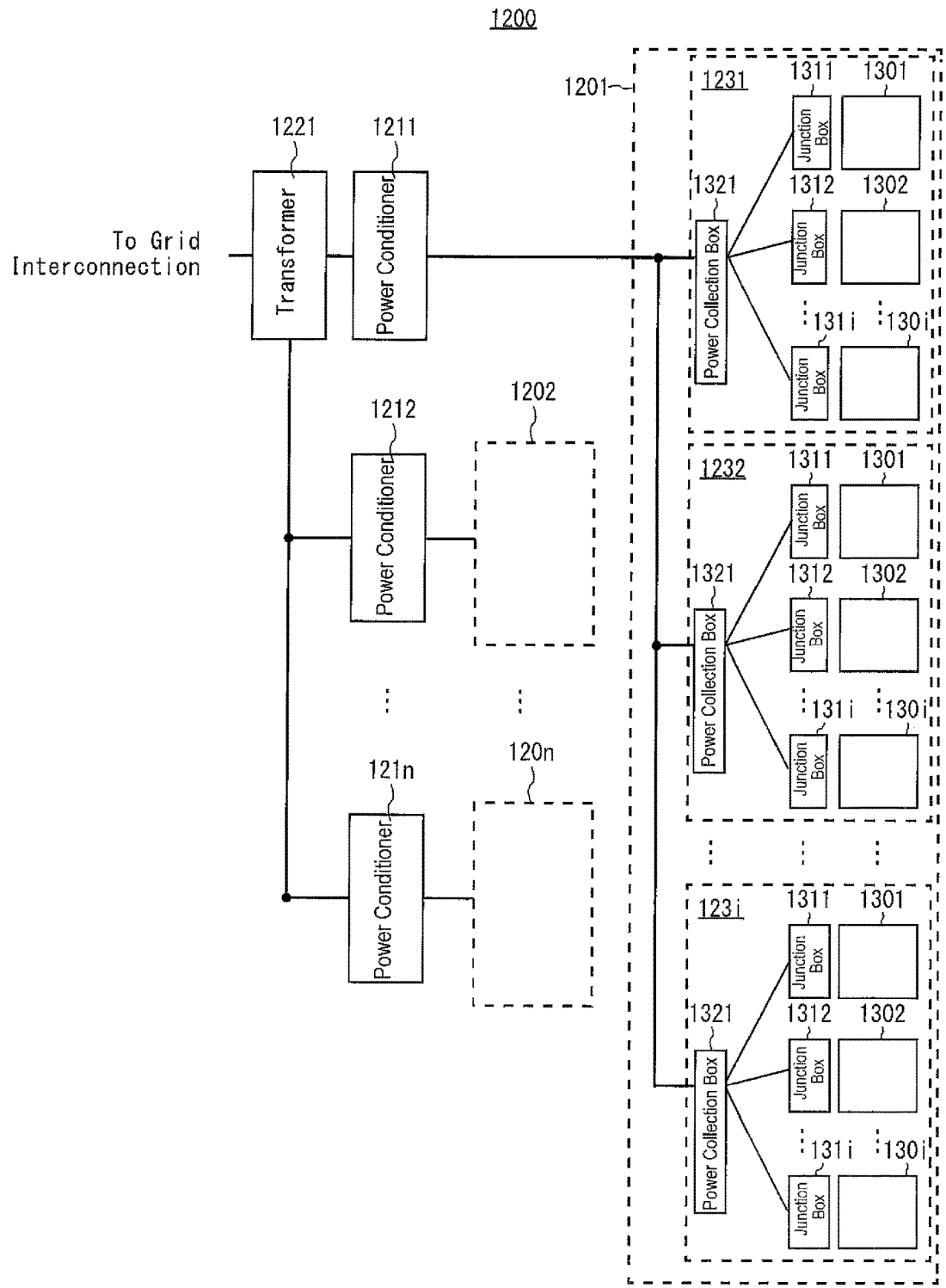

FIG. 31 is a schematic diagram showing a configuration of a solar power generation system including photovoltaic devices in accordance with Embodiment 8.

Figure 32:
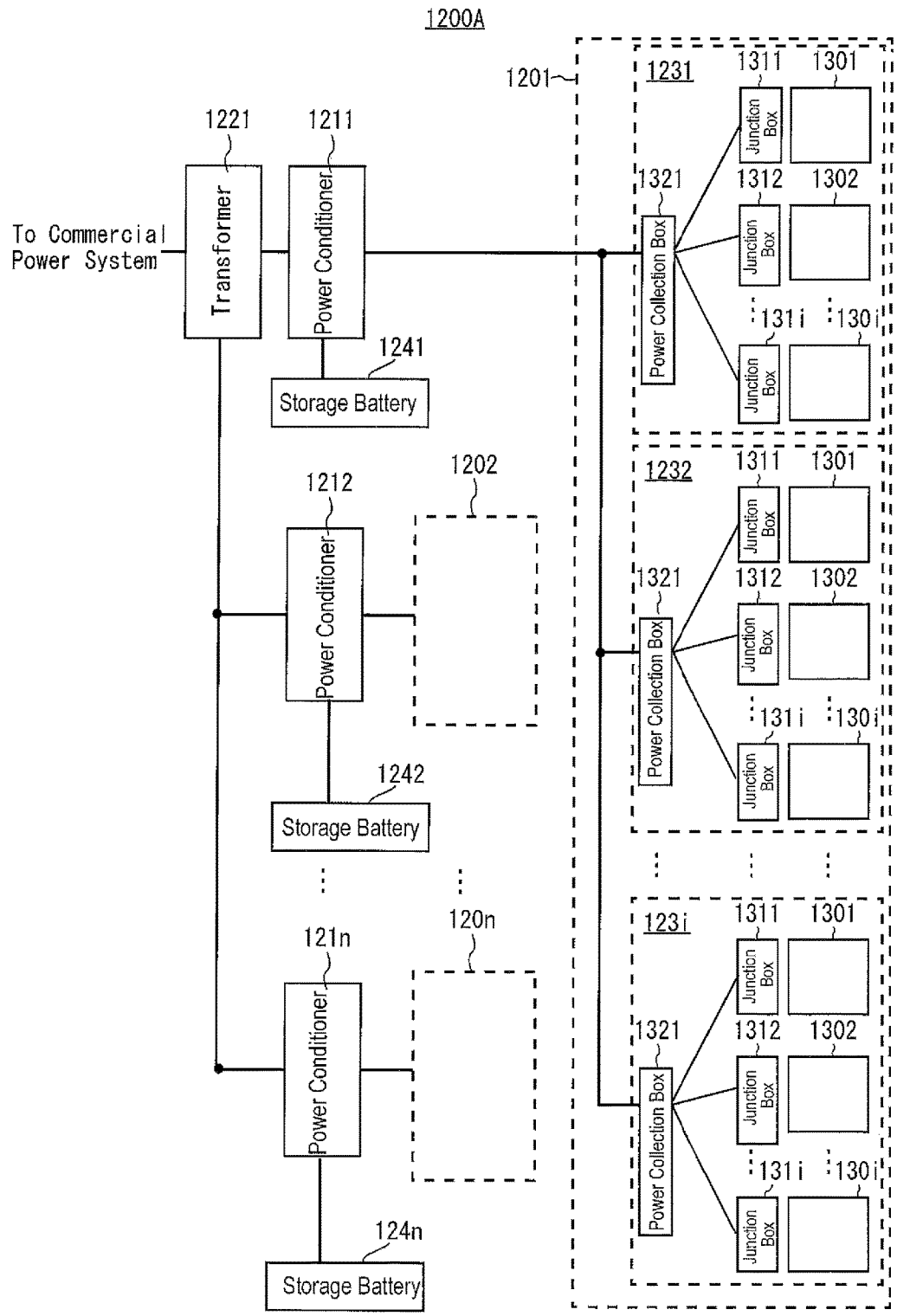

FIG. 32 is a schematic diagram showing a configuration of another solar power generation system including photovoltaic devices in accordance with Embodiment 8.

DESCRIPTION OF EMBODIMENTS

The present invention, in an aspect thereof, is directed to a photovoltaic device including: a semiconductor substrate; n-type amorphous semiconductor strips containing phosphorus as a dopant; and p-type amorphous semiconductor strips containing boron as a dopant, the n- and p-type amorphous semiconductor strips being provided alternately on the semiconductor substrate as viewed along an in-plane direction of the semiconductor substrate, wherein: each of the n-type amorphous semiconductor strips includes a reduced-thickness region on a face thereof adjacent to one of the p-type amorphous semiconductor strips; each of the p-type amorphous semiconductor strips includes a reduced-thickness region on a face thereof adjacent to one of the n-type amorphous semiconductor strips; and the reduced-thickness region of the p-type amorphous semiconductor strip has a steeper angle of inclination than does the reduced-thickness region of the n-type amorphous semiconductor strip, where: a first point is a point at which a thin film formed on the semiconductor substrate has a maximum thickness; a second point is either a point at which a rate of decrease of the thickness of the thin film, as traced along an in-plane direction of the thin film, changes from a first rate of decrease to a second rate of decrease that is larger than the first rate of decrease or a point at which a rate of change of the thickness of the thin film, as traced along the in-plane direction of the thin film, changes sign from negative to positive; and the reduced-thickness region is a region from the first point to the second point as traced along the in-plane direction of the thin film (first aspect).

According to the first aspect, the reduced-thickness region of the p-type amorphous semiconductor strip has a steeper angle of inclination than does the reduced-thickness region of the n-type amorphous semiconductor strip. In other words, the reduced-thickness region of the p-type amorphous semiconductor strip has a smaller width than does the reduced-thickness region of the n-type amorphous semiconductor strip. As the reduced-thickness region grows larger in width, the dopant diffusion region grows larger in width. In this aspect of the invention, however, the width of the reduced-thickness region of the p-type amorphous semiconductor strip is smaller than the width of the reduced-thickness region of the n-type amorphous semiconductor strip. Therefore, the boron contained as a dopant in the p-type amorphous semiconductor strip diffuses less in regions of an intrinsic amorphous semiconductor layer between the n- and p-type amorphous semiconductor strips. Conversion efficiency is hence improved.

In the first aspect, each of the n-type amorphous semiconductor strips may be separated from each adjacent one of the p-type amorphous semiconductor strips by a distance of from 20 µm inclusive to 100 µm exclusive (second aspect). According to the second aspect, the photovoltaic device has a lower series resistance. Conversion efficiency is hence improved.

In the first or second aspect, the n- and p-type amorphous semiconductor strips may be provided on a textured surface of the semiconductor substrate (third aspect). According to the third aspect, incoming light is efficiently admitted into the photovoltaic device, and the surface area is increased. Conversion efficiency is hence further improved.

In any one of the first to third aspects, each of the n- and p-type amorphous semiconductor strips may be provided in a single stretch in a direction perpendicular to a direction in which the n- and p-type amorphous semiconductor strips lie adjacent to each other (fourth aspect). According to the fourth aspect, each of the n- and p-type amorphous semiconductor strips is provided in a single stretch. That allows the regions between the n- and p-type amorphous semiconductor strips to be readily narrowed down. Carriers are hence collected more efficiently.

In any one of the first to third aspects, either the n-type amorphous semiconductor strips or the p-type amorphous semiconductor strips or both may be disposed spaced apart in a direction perpendicular to a direction in which the n- and p-type amorphous semiconductor strips lie adjacent to each other (fifth aspect). According to the fifth aspect, even if the regions between the n- and p-type amorphous semiconductor strips are narrowed down, the semiconductor substrate is less likely to warp or develop other like defects than in the fourth aspect when the n- and p-type amorphous semiconductor strips are formed. The n- and p-type amorphous semiconductor strips are hence formed at appropriate positions.

In any one of the first to third aspects, the n- and p-type amorphous semiconductor strips may be disposed alternately as viewed along two intersecting directions on the semiconductor substrate (sixth aspect). According to the sixth aspect, the n- and p-type amorphous semiconductor strips are disposed alternately as viewed along two directions on the semiconductor substrate. Therefore, carriers can move in the two directions. Conversion efficiency is hence improved over a structure where the n-type amorphous semiconductor strips and the p-type semiconductor strips are disposed alternately in a single direction.

In any one of the first to sixth aspects, the photovoltaic device may further include an intrinsic amorphous semiconductor layer provided on and in contact with the semiconductor substrate (seventh aspect). According to the seventh aspect, boron diffusion is suppressed, and the passivation of the semiconductor substrate is improved.

The following will describe embodiments of the present invention in detail in reference to drawings. Identical or equivalent members will be denoted by the same reference signs in the drawings, and description thereof is not repeated. For clarity purposes, the drawings to which reference will be made in the following description may show structures in a simplified or schematic form or omit some structural members. The relative dimensions of the structural members as shown in the drawings may not represent the actual relative dimensions thereof.

Throughout this specification, the amorphous semiconductor layers (strips) may contain a microcrystalline phase. The microcrystalline phase contains crystals with an average particle diameter of 1 to 50 nm.

Embodiment 1

FIG. 1 is a cross-sectional view showing a structure of a photovoltaic device in accordance with Embodiment 1 of the present invention. Referring to FIG. 1, a photovoltaic device 10 in accordance with Embodiment 1 includes a semiconductor substrate 1, an antireflective film 2, a passivation film 3, n-type amorphous semiconductor strips 4, p-type amorphous semiconductor strips 5, electrodes 6 and 7, and a protective film 8.

The semiconductor substrate 1 is, for example, an n-type monocrystalline silicon substrate. The semiconductor substrate 1 has a thickness of, for example, 100 to 150 µm. The semiconductor substrate 1 has a texture structure formed on one of the surfaces thereof.

The antireflective film 2 is positioned in contact with one of the surfaces of the semiconductor substrate 1. Sunlight is admitted through one of the surfaces of the semiconductor substrate 1 on which the antireflective film 2 is disposed. In the following description, the face on which the antireflective film 2 is disposed will be referred to as the light-receiving face, whereas the face opposite the light-receiving face will be referred to as the back face.

An intrinsic amorphous semiconductor layer and/or n- and p-type amorphous semiconductor layers (strips) may be provided between the antireflective film 2 and the light-receiving face of the semiconductor substrate 1. This alternative structure has the advantage of being able to improve the passivation of the light-receiving face.

The passivation film 3 is positioned in contact with the back face of the semiconductor substrate 1.

The n-type amorphous semiconductor strips 4 are positioned in contact with the passivation film 3.

The p-type amorphous semiconductor strips 5 are positioned adjacent to the n-type amorphous semiconductor strips 4 as traced along an in-plane direction of the semiconductor substrate 1. More particularly, the p-type amorphous semiconductor strips 5 are separated by desired distances from the n-type amorphous semiconductor strips 4 in an in-plane direction of the semiconductor substrate 1.

The n-type amorphous semiconductor strips 4 and the p-type amorphous semiconductor strips 5 are arranged alternately as viewed along an in-plane direction of the semiconductor substrate 1.

The electrodes 6 are positioned on and in contact with the n-type amorphous semiconductor strips 4.

The electrodes 7 are positioned on and in contact with the p-type amorphous semiconductor strips 5.

The protective film 8 is positioned in contact with the passivation film 3, the n-type amorphous semiconductor strips 4, the p-type amorphous semiconductor strips 5, and the electrodes 6 and 7. More particularly, the protective film 8 is, between each two adjacent n- and p-type amorphous semiconductor strips 4 and 5, positioned in contact with parts of the two n- and p-type amorphous semiconductor strips 4 and 5 and the electrodes 6 and 7 thereon and also in contact with a part of the passivation film 3 positioned between the adjacent n- and p-type amorphous semiconductor strips 4 and 5. The protective film 8 leaves openings 8A uncovered on the electrodes 6 and 7 and extends 5 µm or more over the electrodes 6 and 7 beyond the edges of the electrodes 6 and 7.

The antireflective film 2 includes, for example, a silicon nitride film and has a thickness of, for example, 60 nm.

The passivation film 3 is a substantially intrinsic, hydrogen-containing amorphous semiconductor film. The passivation film 3 is composed of, for example, any one of i-type amorphous silicon, i-type amorphous silicon germanium, i-type amorphous germanium, i-type amorphous silicon carbide, i-type amorphous silicon nitride, i-type amorphous silicon oxide, and i-type amorphous silicon carbon oxide. In this example, the passivation film 3 has a thickness of approximately 2 nm. Alternatively, the passivation film 3 may be, for example, a tunnel oxide film composed of, for example, a silicon oxide film.

The n-type amorphous semiconductor strip 4 is an n-type, hydrogen-containing amorphous semiconductor strip. The n-type amorphous semiconductor strip 4 is composed of, for example, n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, or n-type amorphous silicon carbon oxide. The n-type amorphous semiconductor strip 4 contains, for example, phosphorus (P) as an n-type dopant and has a thickness of, for example, 3 to 50 nm.

The p-type amorphous semiconductor strip 5 is a p-type, hydrogen-containing amorphous semiconductor strip. The p-type amorphous semiconductor strip 5 is composed of, for example, p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, or p-type amorphous silicon carbon oxide. The p-type amorphous semiconductor strip 5 contains, for example, boron (B) as a p-type dopant and has a thickness of, for example, 5 to 50 nm.

FIG. 2 contains detailed cross-sectional views of structures of the n-type amorphous semiconductor strip 4 and the p-type amorphous semiconductor strip 5 shown in FIG. 1. Portion (a) of FIG. 2 is a cross-sectional view of the n-type amorphous semiconductor strip 4, and (b) of FIG. 2 is a cross-sectional view of the p-type amorphous semiconductor strip 5.

As shown in (a) of FIG. 2, the n-type amorphous semiconductor strip 4 has a flat region FT and reduced-thickness regions TD(n) as traced along an in-plane direction of the n-type amorphous semiconductor strip 4. The flat region FT has a maximum thickness of the n-type amorphous semiconductor strip 4, and the thickness in the flat region FT is substantially consistent.

Each reduced-thickness region TD(n) extends from point A to point B as traced along the in-plane direction of the n-type amorphous semiconductor strip 4, where point A is an end of the flat region FT, and point B is a point at which the rate of decrease of the thickness changes from a first rate of decrease to a second rate of decrease that is larger than the first rate of decrease. The reduced-thickness regions TD(n) are located on both sides of the flat region FT as traced along the in-plane direction of the n-type amorphous semiconductor strip 4.

The n-type amorphous semiconductor strip 4 has the reduced-thickness regions TD(n) because the n-type amorphous semiconductor strip 4 is formed by plasma CVD (chemical vapor deposition) using a shadow mask as will be described later in detail. The reduced-thickness regions TD(n) have a smaller thickness than the flat region FT and for this reason, have a higher dopant concentration than the flat region FT.

As shown in (b) of FIG. 2, the p-type amorphous semiconductor strip 5 also has a flat region FT and reduced-thickness regions TD(p) similarly to the n-type amorphous semiconductor strip 4. The reduced-thickness regions TD(p) have a smaller thickness than the flat region FT and for this reasons, have a higher dopant concentration than the flat region FT. In addition, in this example, the rate of decrease of the thickness of the reduced-thickness region TD(p) of the p-type amorphous semiconductor strip 5 is larger than the rate of decrease of the thickness of the reduced-thickness region TD(n) of the n-type amorphous semiconductor strip 4 as shown in (a) and (b) of FIG. 2. In other words, the angle of inclination of the reduced-thickness region TD(p) of the p-type amorphous semiconductor strip is steeper than the angle of inclination of the reduced-thickness region TD(n) of the n-type amorphous semiconductor strip 4. In this example, the combined width of the flat region and reduced-thickness regions as measured along the X-axis is 700 µm for the n-type amorphous semiconductor strip 4 and 1,100 µm for the p-type amorphous semiconductor strip 5. Still referring to (a) and (b) of FIG. 2, the width of the flat region FT of the n-type amorphous semiconductor strip 4 as measured in the X-axis direction is smaller than the width of the flat region FT of the p-type amorphous semiconductor strip 5 as measured in the X-axis direction, and the width of the reduced-thickness region TD(p) of the p-type amorphous semiconductor strip 5 in the X-axis direction is smaller than the width of the reduced-thickness region TD(n) of the n-type amorphous semiconductor strip 4 in the X-axis direction.

Referring to (a) of FIG. 2, the electrode 6 is positioned in contact with the entire flat region FT and parts of the reduced-thickness regions TD of the n-type amorphous semiconductor strip 4. Referring to (b) of FIG. 2, the electrode 7 is positioned in contact with the entire flat region FT and parts of the reduced-thickness regions TD(p) of the p-type amorphous semiconductor strip 5.

In this structure, since the reduced-thickness regions TD(n) have a higher dopant concentration than the flat region FT, the resistance encountered by carriers (i.e., electrons) as they move through the n-type amorphous semiconductor strip 4 to the electrode 6 is smaller than it would be if the n-type amorphous semiconductor strip had a thickness that is consistent in an in-plane direction of the passivation film 3. In addition, since the reduced-thickness regions TD(p) have a higher dopant concentration than the flat region FT, the resistance encountered by carriers (i.e., holes) as they move through the p-type amorphous semiconductor strip 5 to the electrode 7 is smaller than it would be if the p-type amorphous semiconductor strip had a thickness that is consistent in the in-plane direction of the passivation film 3. Therefore, this structure improves the conversion efficiency of the photovoltaic device 10.

Alternatively, the electrode 6 may be positioned in contact with the entire reduced-thickness regions TD(n) of the n-type amorphous semiconductor strip 4, and the electrode 7 may be positioned in contact with the entire reduced-thickness regions TD(p) of the p-type amorphous semiconductor strip 5.

In the following description, the reduced-thickness regions TD(n) of the n-type amorphous semiconductor strip 4 and the reduced-thickness regions TD(p) of the p-type amorphous semiconductor strip 5 will be simply referred to as the reduced-thickness regions TD unless there is no need to distinguish between them.

FIG. 3 contains detailed cross-sectional views showing other structures for the n-type amorphous semiconductor strip 4 shown in FIG. 1. Referring to (a) of FIG. 3, the photovoltaic device 10 may include n-type amorphous semiconductor strips 41 in place of the n-type amorphous semiconductor strips 4 and further include electrodes 61 in place of the electrodes 6.

Let point C be a point at which the thickness of the n-type amorphous semiconductor strip 41 is maximum, and point D be a point at which the rate of decrease of the thickness changes from a first rate of decrease to a second rate of decrease that is larger than the first rate of decrease. Then, a reduced-thickness region TD extends from point C to point D as traced along an in-plane direction of the n-type amorphous semiconductor strip 41. The n-type amorphous semiconductor strip 41 has two reduced-thickness regions TD as traced along the in-plane direction of the n-type amorphous semiconductor strip 41. The two reduced-thickness regions TD are positioned in contact with each other in the in-plane direction of the n-type amorphous semiconductor strip 41.

The photovoltaic device 10 may additionally include, in place of the p-type amorphous semiconductor strips 5, p-type amorphous semiconductor strips having the same structure as the n-type amorphous semiconductor strips 41 shown in (a) of FIG. 3. In this arrangement, each p-type amorphous semiconductor strip is also formed such that the angle of inclination of the reduced-thickness region of the p-type amorphous semiconductor strip is steeper than the angle of inclination of the reduced-thickness region of the n-type amorphous semiconductor strip.

The electrode 61 is positioned in contact with a part of one of the two reduced-thickness regions TD and a part of the other reduced-thickness region TD. In this arrangement, the electrodes may also be positioned respectively in contact with the entire two reduced-thickness regions TD of the n-type amorphous semiconductor strip 41 and the entire two reduced-thickness regions TD of the p-type amorphous semiconductor strip having the same structure as the n-type amorphous semiconductor strip 41.

In this structure, since the reduced-thickness regions TD(n) have a higher dopant concentration than the flat region FT, the resistance encountered by carriers (i.e., electrons) as they move through the n-type amorphous semiconductor strip 41 to the electrode 61 is smaller than it would be if the n-type amorphous semiconductor strip had a thickness that is consistent in the in-plane direction of the passivation film 3. In addition, since the reduced-thickness regions TD(p) have a higher dopant concentration than the flat region FT, the resistance encountered by carriers (i.e., holes) as they move through the p-type amorphous semiconductor strip having the same structure as the n-type amorphous semiconductor strip 41 to the electrode is smaller than it would be if the p-type amorphous semiconductor strip had a thickness that is consistent in the in-plane direction of the passivation film 3. Therefore, this structure improves the conversion efficiency of the photovoltaic device 10.

Referring now to (b) of FIG. 3, the photovoltaic device 10 may include n-type amorphous semiconductor strips 42 in place of the n-type amorphous semiconductor strips 4 and further include electrodes 62 in place of the electrodes 6.

Let point E be a point at which the thickness of the n-type amorphous semiconductor strip 42 is maximum, point F be a point at which the rate of decrease of the thickness changes from a first rate of decrease to a second rate of decrease that is larger than the first rate of decrease, and point G be a point at which the rate of change of the thickness changes sign from negative to positive. Then, a reduced-thickness region extends from point E to point F as traced along an in-plane direction of the n-type amorphous semiconductor strip 42, and another reduced-thickness region extends from point E to point G as traced along the in-plane direction of the n-type amorphous semiconductor strip 42. In the following description, the reduced-thickness region extending from point E to point F as traced along the in-plane direction of the n-type amorphous semiconductor strip 42 will be referred to as the reduced-thickness region TD1, and the reduced-thickness region extending from point E to point G as traced along the in-plane direction of the n-type amorphous semiconductor strip 42 will be referred to as the reduced-thickness region TD2.

The n-type amorphous semiconductor strip 42 therefore has two reduced-thickness regions TD1 and two reduced-thickness regions TD2 as traced along the in-plane direction of the n-type amorphous semiconductor strip 42. In this example, the two reduced-thickness regions TD2 are provided such that the thickness distribution thereof is symmetric with respect to a line running through point G, as viewed along the in-plane direction of the n-type amorphous semiconductor strip 42. The two reduced-thickness regions TD1 are on both sides of the two reduced-thickness regions TD2 as traced along the in-plane direction of the n-type amorphous semiconductor strip 42.

The photovoltaic device 10 may additionally include, in place of the p-type amorphous semiconductor strips 5, p-type amorphous semiconductor strips having the same structure as the n-type amorphous semiconductor strips 42 shown in (b) of FIG. 3. In this arrangement, each p-type amorphous semiconductor strip is formed such that the angle of inclination of the reduced-thickness region TD1 of the p-type amorphous semiconductor strip is steeper than the angle of inclination of the reduced-thickness region TD1 of the n-type amorphous semiconductor strip. In other words, each p-type amorphous semiconductor strip is formed such that the angle of inclination of the reduced-thickness region of the p-type amorphous semiconductor strip is steeper than the angle of inclination of the reduced-thickness region of the n-type amorphous semiconductor strip at least as traced along a direction in which the p-type amorphous semiconductor strip lies adjacent to the n-type amorphous semiconductor strip.

The electrode 62 is positioned in contact with the entire two reduced-thickness regions TD2, a part of one of the reduced-thickness regions TD1, and a part of the other reduced-thickness region TD1. The electrodes may be positioned in contact with the entire two reduced-thickness regions TD1 and the entire two reduced-thickness regions TD2 of the n-type amorphous semiconductor strip 42 and also in contact with the entire two reduced-thickness regions TD1 and the entire two reduced-thickness regions TD2 of the p-type amorphous semiconductor strip having the same structure as the n-type amorphous semiconductor strip 42.

In this structure, since the reduced-thickness regions TD(n) have a higher dopant concentration than the flat region FT, the resistance encountered by carriers (i.e., electrons) as they move through the n-type amorphous semiconductor strip 42 to the electrode 62 is smaller than it would be if the n-type amorphous semiconductor strip had a thickness that is consistent in the in-plane direction of the passivation film 3. In addition, since the reduced-thickness regions TD(p) have a higher dopant concentration than the flat region FT, the resistance encountered by carriers (i.e., holes) as they move through the p-type amorphous semiconductor strip having the same structure as the n-type amorphous semiconductor strip 42 to the electrode is smaller than it would be if the p-type amorphous semiconductor strip had a thickness that is consistent in the in-plane direction of the passivation film 3. Therefore, this structure improves the conversion efficiency of the photovoltaic device 10.

As detailed above, the photovoltaic device 10 includes the n- and p-type amorphous semiconductor strips 4 and 5 with reduced-thickness regions (TD, TD1, or TD2) at least on faces thereof where the n-type amorphous semiconductor strips are adjacent to the p-type amorphous semiconductor strips. This reduced-thickness region can be defined as follows. A first point is a point at which the n- or p-type amorphous semiconductor strip has a maximum thickness. A second point is either a point at which the rate of decrease of the thickness of the n- or p-type amorphous semiconductor strip, as traced along an in-plane direction of the n- or p-type amorphous semiconductor strip, changes from a first rate of decrease to a second rate of decrease that is larger than the first rate of decrease or a point at which the rate of change of the thickness changes sign from negative to positive. A reduced-thickness region is then a region from the first point to the second point as traced along the in-plane direction of the n- or p-type amorphous semiconductor strip. The reduced-thickness region of the p-type amorphous semiconductor strip 5 has a steeper angle of inclination than does the reduced-thickness region of the n-type amorphous semiconductor strip.

Next, the electrode 6 will be described in reference to (a) of FIG. 4. The electrode 6 includes conductive layers 6a and 6b. The conductive layer 6a is positioned in contact with the n-type amorphous semiconductor strip 4, whereas the conductive layer 6b is positioned in contact with the conductive layer 6a. The conductive layers 6a and 6b extend from the center of the n-type amorphous semiconductor strip 4 to a distance of H+L/2 on each side of the center in the in-plane direction of the n-type amorphous semiconductor strip 4, where L is the width of the opening 8A in the protective film 8, and H is the distance from an edge of the electrode 6 or 7 to the opening 8A. The width L is, for example, greater than or equal to 20 µm and preferably greater than or equal to 100 µm. The width L, having such a value, ensures adherence between external wiring and the electrodes 6 and 7 and also reduces contact resistance therebetween. Taking into account the adherence between the electrodes 6 and 7 and the protective film 8, the distance H is, for example, greater than or equal to 5 µm.

Referring to (b) of FIG. 4, the electrode 7 includes conductive layers 7a and 7b. The conductive layer 7a is positioned in contact with the p-type amorphous semiconductor strip 5, whereas the conductive layer 7b is positioned in contact with the conductive layer 7a. The conductive layers 7a and 7b extend from the center of the p-type amorphous semiconductor strip 5 to a distance of H+L/2 on each side of the center in the in-plane direction of the p-type amorphous semiconductor strip 5.

As a result, the electrodes 6 and 7 each have a length of 2H+L as measured in the in-plane direction of the n-type amorphous semiconductor strip 4 and the p-type amorphous semiconductor strip 5 respectively.

The protective film 8 has a double-layered structure that includes, for example, protection layers 8a and 8b. To provide the protective film 8 on the n-type amorphous semiconductor strip 4, the protection layer 8a is positioned in contact with the passivation film 3, the n-type amorphous semiconductor strip 4, and the electrode 6, whereas the protection layer 8b is positioned in contact with the protection layer 8a. In contrast, to provide the protective film 8 on the p-type amorphous semiconductor strip 5, the protection layer 8a is positioned in contact with the passivation film 3, the p-type amorphous semiconductor strip 5, and the electrode 7, whereas the protection layer 8b is positioned in contact with the protection layer 8a.

Those regions of the n-type amorphous semiconductor strip 4 outside the edges of the electrode 6, as traced along the in-plane direction of the n-type amorphous semiconductor strip 4, will be referred to as gap regions G1, whereas those regions of the p-type amorphous semiconductor strip 5 outside the edges of the electrode 7, as traced along the in-plane direction of the p-type amorphous semiconductor strip 5, will be referred to as gap regions G2. Therefore, the gap regions G1 are on both sides of the n-type amorphous semiconductor strip 4 as traced along the in-plane direction of the n-type amorphous semiconductor strip 4, whereas the gap regions G2 are on both sides of the p-type amorphous semiconductor strip 5 as traced along the in-plane direction of the p-type amorphous semiconductor strip 5.

The protective film 8 is positioned in contact with the passivation film 3, the n-type amorphous semiconductor strip 4, and the electrode 6 and also in contact with the passivation film 3, the p-type amorphous semiconductor strip 5, and the electrode 7. As a result, there exists a gap region G (=G1+G2) between each two adjacent n- and p-type amorphous semiconductor strips 4 and 5 as traced along the in-plane direction of the semiconductor substrate 1.

The passivation film 3, the n-type amorphous semiconductor strip 4, and the p-type amorphous semiconductor strip 5 are exposed in the gap region G which has a width of 20 µm to 100 µm, inclusive. As shown in FIG. 1, the n-type amorphous semiconductor strip 4 and the p-type amorphous semiconductor strip 5 do not overlap in the gap region G, and the protective film 8 are provided on parts of the electrodes 6 and 7 and on the gap region G.

The conductive layers 6a and 7a in FIG. 4 each include a transparent conductive film that in turn contains, for example, ITO (indium tin oxide), ZnO, or IWO (indium tungsten oxide).

The conductive layers 6b and 7b each include a metal that may be, for example, any of Ag, Al, nickel (Ni), copper (Cu), tin (Sn), platinum (Pt), gold (Au), chromium (Cr), tungsten (W), cobalt (Co), and titanium (Ti), their alloys, and laminates of two or more layers of these metals.

The conductive layers 6a and 7a are preferably transparent conductive films with good adherence to the n-type amorphous semiconductor strip 4 and the p-type amorphous semiconductor strip 5 respectively. The conductive layers 6b and 7b preferably contain a high-conductivity metal.

The conductive layers 6a and 7a each have a thickness of, for example, 3 to 100 nm, preferably greater than or equal to 50 nm, and in Embodiment 1, 0.8 µm as an example.

In Embodiment 1, the electrode 6 may include the conductive layer 6b alone, and the electrode 7 may include the conductive layer 7b alone. In such a structure where the conductive layers 6a and 7a are missing, the conductive layers 6b and 7b are in contact with the n-type amorphous semiconductor strip 4 and the p-type amorphous semiconductor strip 5 respectively.

When the conductive layers 6a and 7a are missing, the conductive layers 6b and 7b include a metal film. In such a structure, the conductive layers 6b and 7b are preferably metals with high adherence to the underlying n- and p-type amorphous semiconductor strips 4 and 5 respectively. For example, the conductive layers 6b and 7b have a layered structure that includes: an adhesion layer composed of, for example, Ti, Ni, Al, or Cr and having a thickness approximately 1 to 10 nm; and a reflective metal layer composed primarily of Al or Ag.

The conductive layers 6b and 7b, provided in contact with the protective film 8, need to exhibit good adherence to the protective film 8. If the protective film 8 is, for example, an oxide of, for example, silicon, aluminum, titanium, or zirconia, a film of silicon nitride or aluminum nitride, or a film of silicon oxynitride or aluminum oxynitride, the surfaces of the conductive layers 6b and 7b on which the protective film 8 is provided are preferably composed of a metal such as Al, indium (In), Ti, Ni, Cu, Cr, W, Co, palladium (Pd), or Sn.

Alternatively, the electrodes 6 and 7 may each be a single transparent conductive film. In this structure, the transparent conductive film is composed of, for example, ITO as described above.

The protection layers 8a and 8b each include an inorganic insulating film of, for example, an oxide, a nitride, or an oxynitride.

This oxide is, for example, an oxide of silicon, aluminum, titanium, zirconia, hafnium, zinc, tantalum, or yttrium.

The nitride is, for example, a nitride of silicon or aluminum.

The oxynitride is, for example, an oxynitride of silicon or aluminum.

The protection layer 8b includes a different type of inorganic insulating film than does the protection layer 8a. In other words, the protection layers 8a and 8b are formed of different types of films selected from the inorganic insulating films listed above.

As a further alternative, the protection layers 8a and 8b may be composed, respectively, of a semiconductor and one of the inorganic insulating films listed above.

In such a structure, the semiconductor is an amorphous semiconductor. Examples of this amorphous semiconductor include amorphous silicon, amorphous silicon germanium, amorphous germanium, amorphous silicon carbide, amorphous silicon nitride, amorphous silicon oxide, amorphous silicon oxynitride, and amorphous silicon carbon oxide. The protection layer 8a is preferably composed of an intrinsic amorphous semiconductor because high insulation better suppresses leakage between the electrodes 6 and 7. As an example, the protection layer 8a is composed of an intrinsic amorphous silicon, and the protection layer 8b is composed of a silicon nitride film.

Meanwhile, if the protection layer 8b is composed of an insulating film, the protection layer 8a may be composed of an n- or p-type amorphous semiconductor.

The protection layer 8b is preferably composed of a dielectric film with positive fixed charge. Examples of the dielectric film with positive fixed charge include a silicon nitride film and a silicon oxynitride film.

Since the semiconductor substrate 1 is composed of an n-type monocrystalline silicon, if the protection layer 8b is composed of a dielectric film with positive fixed charge, the protection layer 8b produces an electric field acting on holes, which is a minority carrier, so that the minority carrier (i.e., holes) can have an extended lifetime in the gap regions G.

The protective film 8 is by no means limited to a double-layered structure and may have either a single-layered structure or a multi-layered structure (i.e., a structure with two or more layers). If the protective film 8 has a single-layered structure, the protective film 8 is composed of a single type of film selected from the inorganic insulating films listed above. If the protective film 8 has a multi-layered structure, the protective film 8 includes the protection layers 8a and 8b in the multi-layered structure thereof.

If the protective film 8 has a double-layered structure as mentioned earlier, passivation of the n- and p-type amorphous semiconductor strips 4 and 5 and insulation between the electrodes 6 and 7 can both be achieved by forming the protection layer 8a of an amorphous semiconductor and the protection layer 8b of an insulating film. Meanwhile, if the protective film 8 includes any one of the inorganic insulating films listed above in the multi-layered structure thereof, the protective film 8 can repel moisture by preventing water from diffusing into the amorphous semiconductor strips (n- and p-type amorphous semiconductor strips 4 and 5). Among the inorganic insulating films listed above, a silicon nitride film and a silicon oxynitride film are particularly preferred to the other inorganic insulating films for their high moisture-proof properties.

For example, if the protective film 8 has a multi-layered structure (i.e., a structure with two or more layers), for example, a triple-layered structure, one of the protection layers (a protection layer in contact with the n- and p-type amorphous semiconductor strips 4 and 5) is formed of an amorphous semiconductor, and the remaining two protection layers are formed of different types of films selected from the inorganic insulating films. On the other hand, if the protective film 8 has a single- or multi-layered structure, the protective film 8 may have a structure in which, for example, an insulating film of an organic material is provided on an inorganic insulating film listed above. Examples of the organic material include imide-based resin, epoxy resin, fluorine resin, polycarbonate, and liquid crystal polymer. The imide-based resin may be, for example, polyimide. The fluorine resin may be, for example, polytetrafluoroethylene (PTFE). Alternatively, the organic material may be a screen-printed resist.

Manufacturing Method

FIGS. 5 to 9 are first to fifth manufacturing step diagrams illustrating a method of manufacturing the photovoltaic device 10 shown in FIG. 1.

Referring to FIG. 5, upon starting the manufacture of the photovoltaic device 10, a wafer with a thickness of 100 μm to 300 μm is cut out from bulk silicon using a wire saw. The wafer is then subjected to etching twice, once to remove a damaged layer from the surface of the wafer and again to adjust the thickness, in order to prepare a semiconductor substrate 1' (see the step shown in (a) of FIG. 5).

A semiconductor substrate having a texture structure is generally manufactured by slicing a silicon ingot with, for example, a wire saw and etching a resultant semiconductor substrate. A texture structure is formed typically on a sliced semiconductor substrate prepared by a loose abrasive process. A similar texture structure can be formed however on a sliced substrate prepared by a fixed abrasive process, owing to reduced cost and improved slicing technology.

The semiconductor substrate 1' can be wet-etched using an alkaline etchant. This etching, if conducted in a solution of sodium hydroxide, proceeds, for example, via the following reactions (1), (2), and (3):

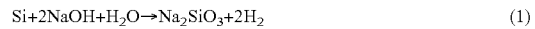

$$Si+2NaOH+H_2O \rightarrow Na_2SiO_3+2H_2 \quad (1)$$

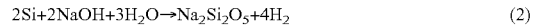

$$2Si+2NaOH+3H_2O \rightarrow Na_2Si_2O_5+4H_2 \quad (2)$$

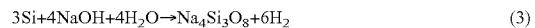

$$3Si+4NaOH+4H_2O \rightarrow Na_4Si_3O_8+6H_2 \quad (3)$$

Anisotropic etching is performed, for example, using an etchant in order to form a texture structure on one of the surfaces of the semiconductor substrate 1'. The etchant is prepared so as to achieve a desirable etching rate. A texture structure is formed on one of the surfaces of the semiconductor substrate 1' by the following mechanism. Etching rate on the semiconductor substrate 1' in a process using an alkali aqueous solution is highest on the (100) face of the silicon and lowest on the (111) face. Therefore, if the etching rate is reduced by adding to the alkali aqueous solution a particular additive that reduces etching rate (hereinafter, may be referred to as an "etching suppressing agent"), the (100) and other crystal faces of the silicon that are relatively easily etched are etched preferentially, and the (111) face, on which etching rate is relatively low, remains relatively intact on the surface. Because the (111) face inclines at approximately 54° with respect to the (100) face, a structure containing pyramidal convexities constituted by (111) faces and their equivalent faces is formed in the last stage of the process.

However, texture may be formed with approximately 40° to 54° inclines, depending on etching conditions. The inclined faces of the texture are not necessarily (111) faces. In other words, the inclined faces of the texture do not need to be (111) faces, and as an example, the texture may have gentle inclines.

In the texture forming process, an etchant may be used that is obtained by adding isopropyl alcohol as an etching suppressing agent to an aqueous solution of sodium hydroxide (NaOH). This etchant is heated to approximately 60 to 80° C., and the semiconductor substrate with (100) faces is immersed in the heated etchant for 10 to 30 minutes for etching.

If an etchant is used that contains sodium hydroxide or potassium hydroxide, a particular additive such as lignin, and sodium hydrogen carbonate or potassium hydrogen carbonate, a texture structure can be formed with tiny pyramidal structures (which measure 1 μm or less in height, from the bottom of the concavity to the apex of the convexity). The texture dimensions can be controlled in this manner, by changing various conditions such as the temperature of the etchant, processing time, the type of the etching suppressing agent, etching rate, and the type of the substrate.

Subsequently to the step shown in (a) of FIG. 5, a film of for example, SiN or SiO$_2$ is formed on the back face of the semiconductor substrate 1' by, for example, sputtering or CVD. This film has a thickness of, for example, 50 nm to 500 nm. The semiconductor substrate 1' is then etched using an alkaline solution of, for example, NaOH or KOH (e.g., an aqueous solution of 1 to 5 wt % KOH and 1 to 10 wt %/o isopropyl alcohol). The film of, for example, SiN or SiO$_2$ formed on the back face serves as a protective film in the etching. This protective film is removed by dissolving it in hydrofluoric acid after the etching is finished. This procedure concludes the anisotropic etching of the light-receiving face of the semiconductor substrate 1'. The semiconductor substrate 1 is thus obtained with pyramidal texture structures formed on the light-receiving face thereof (see the step shown in (b) of FIG. 5).

Subsequently, an amorphous semiconductor layer 11 is formed on the light-receiving face of the semiconductor substrate 1, and a passivation film 3 is formed on the back face of the semiconductor substrate 1 (see the step shown in (c) of FIG. 5). The amorphous semiconductor layer 11 may be an intrinsic amorphous semiconductor layer, an n- or p-type amorphous semiconductor layer, or a laminate of these layers and is formed by, for example, plasma CVD. The passivation film 3 is a substantially intrinsic, hydrogen-containing amorphous semiconductor film and composed of, for example, any one of i-type amorphous silicon, i-type amorphous silicon germanium, i-type amorphous germanium, i-type amorphous silicon carbide, i-type amorphous silicon nitride, i-type amorphous silicon oxide, and i-type amorphous silicon carbon oxide. The passivation film 3 has a thickness of approximately 2 nm.

Alternatively, if the passivation film 3 is a tunnel oxide film composed of a silicon oxide film, the semiconductor substrate 1 is subjected to an oxidation process. The semiconductor substrate 1 may be oxidized by either wet processing or thermal oxidation. In wet oxidation, for example, the semiconductor substrate 1 is immersed in, for example, hydrogen peroxide, nitric acid, or ozonated water and thereafter heated at 800 to 1,000° C. in a dry atmosphere. In thermal oxidation, for example, the semiconductor substrate 1 is heated to 900 to 1,000° C. in an oxygen or water vapor atmosphere.

Following the step shown in (c) of FIG. 5, a silicon nitride film 12 is formed in contact with the amorphous semiconductor layer 11 by sputtering, EB (electron beam) vapor deposition, or CVD. This procedure concludes the formation of the antireflective film 2 on the light-receiving face of the semiconductor substrate 1 (see the step shown in (d) of FIG. 6).

After the step shown in (d) of FIG. 6, the semiconductor substrate 1 is put in a reaction chamber of a plasma unit, and a shadow mask 30 is placed over the passivation film 3 of the semiconductor substrate 1 (see the step shown in (e) of FIG. 6).

Portion (a) of FIG. 10 is a plan view of the shadow mask 30 as viewed from above, and (b) of FIG. 10 is a cross-sectional view of the shadow mask 30 taken along line I-I in (a) of FIG. 10. Referring to (a) of FIG. 10, the shadow mask 30 has a plurality of openings 30a at predetermined intervals as traced along the X-axis direction. All the openings 30a are rectangular with substantially the same length and width. Referring to (b) of FIG. 10, the openings 30a have a rectangular cross-section with substantially the same opening width (=W2) on the top and bottom sides of the shadow mask 30.

The shadow mask 30 is composed of, for example, a metal such as stainless steel. The shadow mask 30 has, as an example, a thickness of 200 μm, an opening width W2 of 850 μm on both the top and bottom sides, a masking width W1 of 1,050 μm, and a cycle of 1,900 μm (=W1+W2).

Then, the temperature of the semiconductor substrate 1 is set to 130 to 180° C., hydrogen (H$_2$) gas, SiH$_4$ gas, and phosphine (PH$_3$) gas are fed to the reaction chamber at 0 to 100 sccm, 40 sccm, and 40 sccm respectively, and the pressure inside the reaction chamber is set to 40 to 120 Pa. Thereafter, high frequency electric power (13.56 MHz) with an RF power density of 5 to 30 mW/cm$^2$ is applied to parallel planar electrodes. The PH$_3$ gas is diluted with hydrogen to a concentration of, for example, 1%.

This procedure deposits n-type amorphous silicon on areas of the passivation film 3 that are not covered with the shadow mask 30, thereby forming the n-type amorphous semiconductor strips 4 on the passivation film 3 (see the step shown in (f) of FIG. 6). The n-type amorphous semiconductor strips 4 with the reduced-thickness regions TD(n) are thus formed on the passivation film 3. In addition, n-type amorphous silicon 31 is deposited also on the shadow mask 30.

There exist gaps between the shadow mask 30 and the passivation film 3. The active species of, for example, SiH and SiH$_2$ produced in plasma-assisted decomposition flow into the gaps between the shadow mask 30 and the passivation film 3, causing the n-type amorphous semiconductor strips 4 to extend to some degree under the areas covered with the shadow mask 30. The n-type amorphous semiconductor strips 4 with the reduced-thickness regions TD(n) are thus formed on the passivation film 3.

Incidentally, the width of the reduced-thickness region TD(n) of the n-type amorphous semiconductor strip 4 and the rate of decrease of the thickness of the reduced-thickness region TD(n), that is, the angle of inclination of the reduced-thickness region TD(n), can be controlled by changing the pressure at which the n-type amorphous semiconductor strips 4 are formed, the thickness of the shadow mask 30, and the opening width of the shadow mask 30.

Following the step shown in (f) of FIG. 6, a shadow mask 40, in place of the shadow mask 30, is placed over the passivation film 3 and the n-type amorphous semiconductor strips 4 (see the step shown in (g) of FIG. 7). The material, thickness, and opening width of the shadow mask 40 are the same as those of the shadow mask 30. The shadow mask 40 differs from the shadow mask 30 in the cross-sectional structure of the openings.

Portion (a) of FIG. 11 is a plan view of the shadow mask 40 as viewed from above, and (b) of FIG. 11 is a cross-sectional view of the shadow mask 40 taken along line II-II in (a) of FIG. 11. Referring to (a) of FIG. 11, the shadow mask 40 has a plurality of openings 40a at predetermined intervals as traced along the X-axis direction. All the openings 40a are rectangular with substantially the same length and width. Referring to (b) of FIG. 11, the openings 40a have a trapezoidal cross-section with the opening width being narrower on the bottom side of the shadow mask 40 than on the top side (W22<W21).

The shadow mask 40 is shown at a distance from the passivation film 3 in the step shown in (g) of FIG. 7. The shadow mask 40 is in practice placed very proximate to the passivation film 3 because the n-type amorphous semiconductor strips 4 are, as mentioned earlier, as extremely thin as 3 to 50 nm.

Then, the temperature of the semiconductor substrate 1 is set to 130 to 180° C. $H_2$ gas, $SiH_4$ gas, and diborane ($B_2H_6$) gas are fed to the reaction chamber at 0 to 100 sccm, 40 sccm, and 40 sccm respectively, and the pressure inside the reaction chamber is set to 40 to 200 Pa. More preferably, the pressure inside the reaction chamber is set lower than the pressure at which the n-type amorphous semiconductor strips 4 are formed (e.g., 60 Pa). Thereafter, high frequency electric power (13.56 MHz) with an RF power density of 5 to 30 mW/cm$^2$ is applied to parallel planar electrodes. The $B_2H_6$ gas is diluted with hydrogen to a concentration of, for example, 2%. The p-type amorphous semiconductor strips 5 can be formed in accordance with the present embodiment under different conditions: for example, the RF power density may be 20 mW/cm$^2$, the $B_2H_6$ gas/$SiH_4$ gas ratio 0.5%, and the $H_2$ gas/$SiH_4$ gas ratio 50%.

This procedure deposits p-type amorphous silicon on areas of the passivation film 3 that are not covered with the shadow mask 40, thereby forming the p-type amorphous semiconductor strips 5 on the passivation film 3. In addition, p-type amorphous silicon 32 is deposited also on the shadow mask 40 (see the step shown in (h) of FIG. 7).

There exist gaps between the shadow mask 40 and the passivation film 3. The active species of, for example, SiH and SiH$_2$ produced in plasma-assisted decomposition flow into the gaps between the shadow mask 40 and the passivation film 3, causing the p-type amorphous semiconductor strips 5 to extend to some degree under the areas covered with the shadow mask 40. The p-type amorphous semiconductor strips 5 with the reduced-thickness regions TD(p) are thus formed on the passivation film 3. Non-activated boron (B) flows into, and deposits to some degree under, the areas covered with the shadow mask 40.

FIG. 12A represents a p-type amorphous semiconductor strip formed under conditions similar to those under which the n-type amorphous semiconductor strips 4 are formed and by using a shadow mask similar to the one used to form the n-type amorphous semiconductor strips 4 and also represents boron concentration in that p-type amorphous semiconductor strip. Referring to FIG. 12A, in the p-type amorphous semiconductor strip 5', boron concentration is higher in the reduced-thickness regions TD'(p) than in the flat region FT. Still referring to FIG. 12A, the boron concentration has a peak in the reduced-thickness regions TD'(p). The boron concentration, although generally decreasing in the regions of the p-type amorphous semiconductor strip 5' near the edges of the p-type amorphous semiconductor strip 5' outside the reduced-thickness regions TD'(p), is higher in parts of these edge regions than in the flat region FT, which indicates that boron (B) has diffused to gap regions where no p-type amorphous semiconductor strip 5' is formed.

Because boron (B) (p-type dopant) is lighter than phosphorus (P) (n-type dopant), boron (B) flows relatively easily into areas other than those under the openings of the shadow mask 40 and hence diffuses into the gap regions G. The diffusion of boron (B) on the passivation film 3 affects passivation adversely. In contrast, phosphorus (P), even if it diffuses into the gap regions G, affects passivation far less adversely than boron (B). For these reasons, if after the n-type amorphous semiconductor strips 4 are formed, the p-type amorphous semiconductor strips 5 are formed so as to overlap the n-type amorphous semiconductor strips 4 in the gap regions G, the adverse influence of boron (B) diffusion could be reduced. In this structure, however, carriers may leak in areas where the p-type amorphous semiconductor strip 5 overlaps the n-type amorphous semiconductor strip 4, which renders the structure unfavorable. With all these factors considered, boron (B) diffusion should be restrained without allowing the p-type amorphous semiconductor strips 5 and the n-type amorphous semiconductor strips 4 to overlap in the gap regions G.

FIG. 12B is a diagram illustrating the p-type amorphous semiconductor strip 5 in accordance with the present embodiment and also illustrating boron concentration in the p-type amorphous semiconductor strip 5. Referring to FIG. 12B, in the p-type amorphous semiconductor strip 5, boron concentration is higher in the reduced-thickness regions TD(p) than in the flat region FT. However, near the edges of the p-type amorphous semiconductor strip outside the reduced-thickness regions TD(p), boron concentration decreases more quickly in the p-type amorphous semiconductor strip 5 than in the p-type amorphous semiconductor strip 5' shown in FIG. 12A, and boron (B) diffuses less broadly in the p-type amorphous semiconductor strip 5 than in the p-type amorphous semiconductor strip 5'. These observations indicate that the p-type amorphous semiconductor strip 5, formed with a steeper angle of inclination in the reduced-thickness regions than the n-type amorphous semiconductor strip 4, reduces boron-diffused regions and restrains boron (B) diffusion.

The width of the gap regions G affects conversion efficiency. FIG. 13 is a graph representative of a relationship between the series resistance Rs of the photovoltaic device and the width of the gap regions. It would be understood from FIG. 13 that the series resistance Rs increases, hence conversion efficiency decreases, with the increasing width of the gap regions G. With the ratio of the widths of the n- and p-type amorphous semiconductor strips varied, the series resistance Rs still increases with the increasing width of the gap regions G (not shown) similarly to FIG. 13.

As can be seen from FIG. 13, the series resistance Rs has a steeper slope for the width of the gap regions G from 100 μm to 50 μm than for the width from 100 μm to 200 μm. The series resistance Rs decreases more quickly for the width less than 100 μm. In other words, the width of 100 μm gives an inflection point at which the rate of decrease of the series resistance Rs changes. The width of the gap regions G is preferably smaller than 100 μm.

As described above, the series resistance of the photovoltaic device can be reduced if the width of the gap regions G is reduced to less than 100 μm. Meanwhile, as the width of the gap regions G is reduced, it becomes increasingly difficult to precisely align the n-type amorphous semiconductor strips and the p-type amorphous semiconductor strips, and it becomes increasingly likely that the n-type amorphous semiconductor strips and the p-type amorphous semiconductor strips overlap. If the n-type amorphous semiconductor strips and the p-type amorphous semiconductor strips overlap, electrical properties deteriorate at p-n junctions.

FIG. 14 is a diagram representing reverse current density measurements made at room temperature on photovoltaic devices in which the n-type amorphous semiconductor strips and the p-type amorphous semiconductor strips overlap by 0 μm, 100 μm, and 200 μm and photovoltaic devices in which the n-type amorphous semiconductor strips are separated from the p-type amorphous semiconductor strips by gap regions as wide as 100 μm and 200 μm. As can be seen from FIG. 14, if the n-type amorphous semiconductor strips and the p-type amorphous semiconductor strips overlap, reverse current density increases, and electrical properties deteriorate, in comparison with photovoltaic devices with gap regions.

Therefore, it is necessary to provide gap regions G that are as narrow as possible so that the n-type amorphous semiconductor strips and the p-type amorphous semiconductor strips do not overlap. It is nevertheless difficult to completely eliminate discrepancy in alignment in forming the n-type amorphous semiconductor strips and the p-type amorphous semiconductor strips by using respective shadow masks. Therefore, with alignment discrepancies (e.g., approximately ±5 µm) considered, the width of the gap regions G is preferably from 20 µm inclusive to 100 µm exclusive.

In the step shown in (h) of FIG. 7, after the p-type amorphous semiconductor strips 5 are formed by deposition, the shadow mask 40 is removed, which leaves the n-type amorphous semiconductor strips 4 and the p-type amorphous semiconductor strips 5 formed on the passivation film 3 alternately as viewed along the in-plane direction of the semiconductor substrate 1 (see the step shown in (i) of FIG. 7).

After the step shown in (i) of FIG. 7, a shadow mask 50 is placed such that the openings thereof are positioned above the n-type amorphous semiconductor strips 4 and the p-type amorphous semiconductor strips 5 (see the step shown in (j) of FIG. 8). The shadow mask 50 is composed of the same material and has the same thickness as the shadow mask 30. The opening width of the shadow mask 50 is set equal to the combined width of the flat region FT and the two reduced-thickness regions TD of the n-type amorphous semiconductor strips 4 and the p-type amorphous semiconductor strips 5. The opening width may be a little larger or smaller than this combined width.

Following the step shown in (j) of FIG. 8, the conductive layers 6a and 7a and the conductive layers 6b and 7b are deposited sequentially using the shadow mask 50. The electrodes 6 and 7 are formed in this manner by deposition on the n-type amorphous semiconductor strips 4 and the p-type amorphous semiconductor strips 5 respectively (see the step shown in (k) of FIG. 8).

The conductive layers 6a, 7a, 6b, and 7b are formed by sputtering, vapor deposition, ion plating, thermal CVD, MOCVD (metal organic chemical vapor deposition), sol-gel processing, spray heating of liquefied source material, or inkjet processing.

The conductive layers 6a and 7a are, for example, ITO, IWO, or ZnO. The conductive layers 6b and 7b have a double-layered structure of Ti (3 nm) and Al (500 nm).

An ITO layer can be formed by, for example, subjecting an ITO target doped with 0.5 to 4 wt % $SnO_2$ to sputtering in argon gas or a mixed gas of argon gas and oxygen gas at a substrate temperature of 25 to 250° C., under pressure of 0.1 to 1.5 Pa, and with electric power of 0.01 to 2 kW.

A ZnO layer can be formed by subjecting a ZnO target doped with 0.5 to 4 wt % Al, instead of an ITO target, to sputtering under similar conditions.

The Ti/Al double-layered structure can be formed by EB vapor deposition.

The electrodes 6 and 7 may be formed by forming the conductive layers 6b and 7b respectively on the conductive layers 6a and 7a as seed electrodes by plating. If the electrodes 6 and 7 are formed in this manner, the conductive layers 6b and 7b are composed of, for example, Ni, W, Co, Ti, Cr, an alloy of these metals, or an alloy of these alloys and P or B. The conductive layers 6b and 7b may be plated with, for example, Cu, Al, or Sn.

Subsequently to the step shown in (k) of FIG. 8, a shadow mask 60 is placed over the electrodes 6 and 7 (see the step shown in (l) of FIG. 8). The shadow mask 60 is composed of the same material and has the same thickness as the shadow mask 30.

The protective film 8 is then formed on the passivation film 3, the n-type amorphous semiconductor strips 4, the p-type amorphous semiconductor strips 5, and the electrodes 6 and 7.

More specifically, an intrinsic amorphous semiconductor film and a silicon nitride film are deposited sequentially on the passivation film 3, the n-type amorphous semiconductor strips 4, the p-type amorphous semiconductor strips 5, and the electrodes 6 and 7 by plasma CVD. In such deposition, the intrinsic amorphous semiconductor film can be formed to a thickness of, for example, 10 nm by using, for example, $SiH_4$ gas as a source gas. The silicon nitride film can be formed to a thickness of, for example, 120 nm by using, for example, $SiH_4$ gas and $NH_3$ gas as source gases. These procedures complete the formation of the photovoltaic device 10 (see the step shown in (m) of FIG. 9).

In the description above, stainless steel was given as an example of material for the shadow masks 30, 40, 50, and 60. The shadow masks 30, 40, 50, and 60 are however not necessarily composed of stainless steel and may be composed of, for example, copper, nickel, nickel alloy (e.g., Alloy 42 or Invar), or molybdenum.

The shadow masks 30, 40, 50, and 60 are not necessarily a metal mask and may be, for example, a glass mask, a ceramic mask, or an organic film mask.

The shadow masks 30, 40, 50, and 60 may be prepared by etching a semiconductor substrate composed of the same material as the semiconductor substrate 1. In such a case, since the semiconductor substrate 1 and the shadow mask are of the same material, they have the same thermal expansion coefficient and are free from positional deviations caused by differences in thermal expansion coefficient.

When the thermal expansion coefficient of the semiconductor substrate 1 and material cost are considered, the shadow masks 30, 40, 50, and 60 are preferably composed of Alloy 42. With the thermal expansion coefficient of the semiconductor substrate 1 considered, if the shadow masks 30, 40, 50, and 60 are approximately 36% nickel and approximately 64% iron, the shadow masks 30, 40, 50, and 60 will exhibit a thermal expansion coefficient that is closest to that of the semiconductor substrate 1, minimizing alignment errors caused by differences in thermal expansion coefficient.

The thickness of the shadow masks 30, 40, 50, and 60 is preferably such that they can be recycled and reused many times to reduce running costs in manufacturing. Films adhering to the shadow masks 30, 40, 50, and 60 after a use can be removed by hydrofluoric acid or NaOH. Considering the number of times that the shadow masks 30, 40, 50, and 60 are recycled, the thickness of the shadow masks 30, 40, 50, and 60 is preferably from 100 µm to 200 µm and more preferably 150 µm.

According to the manufacturing method described above, the intrinsic amorphous semiconductor film and silicon nitride film that constitute the protective film 8 are formed consecutively in a single reaction chamber. This is merely an example of the present embodiment. Alternatively, the work may be exposed to air once, for example, by subsequently to the formation of the intrinsic amorphous semiconductor layer, moving the work to a sputtering or other CVD device where the silicon nitride film is to be formed.

The intrinsic amorphous semiconductor film and silicon nitride film that constitute the protective film 8 are preferably formed without being exposed to air because by doing so, the films are less likely to be contaminated with organic matter and the water content of air.

As a further alternative, the protective film 8 may be formed by EB vapor deposition, sputtering, laser abrasion, CVD, or ion plating.

As a further alternative, in the present embodiment, a SiON passivation film may be formed by subsequently to the formation of the passivation film 3, nitridizing the passivation film 3 by plasma CVD using nitrogen ($N_2$) gas. The formation of such a passivation film restrains the boron (B) in the p-type amorphous semiconductor strips 5 on the passivation film 3 from diffusing into the semiconductor substrate 1. The formation of the SiON passivation film is preferable because boron (B) diffusion is effectively reduced even when the passivation film 3 is formed with a thickness that permits tunneling current.

Next, a method of manufacturing a solar cell module containing photovoltaic devices 10 will be described. FIG. 15 contains plan views of the photovoltaic device 10 shown in FIG. 1 as viewed from the back side thereof. Referring to (a) of FIG. 15, the n-type amorphous semiconductor strips 4 and the p-type amorphous semiconductor strips 5 are arranged alternately at desired intervals as viewed along the in-plane direction of the semiconductor substrate 1. The electrodes 6 and 7 are provided on the n-type amorphous semiconductor strips 4 and the p-type amorphous semiconductor strips 5 respectively. As a result, gap regions G are provided between adjacent electrodes 6 and 7.

Referring to (b) of FIG. 15, the protective film 8 is disposed on the gap regions G and the peripheral regions of the semiconductor substrate 1. The openings 8A with the width L are formed on the electrodes 6 and 7. The electrodes 6 and 7 are connected to a wiring sheet (detailed later) via the openings 8A.

Portion (b) of FIG. 15 shows some peripheral regions of the semiconductor substrate 1 that are not covered with the protective film 8. However, the photovoltaic device 10 most preferably has the back face of the semiconductor substrate 1 completely covered with a protective film and leaves parts of the electrodes 6 and 7 exposed.

FIG. 16 is a plan view of a wiring sheet. Referring to FIG. 16, a wiring sheet 70 includes an insulating base member 710 and wiring members 71 to 87.

The insulating base member 710 only needs to be electrically insulating. Any electrically insulating material may be used without particular limitation. The insulating base member 710 is composed of, for example, polyethylene terephthalate (PET), polyethylene naphthalate (PEN), polyphenylene sulfide (PPS), polyvinyl fluoride (PVF), or polyimide.

The thickness of the insulating base member 710 is not particularly limited and preferably from 25 μm to 150 μm, inclusive. The insulating base member 710 may have either a single-layered structure or a multi-layered structure (i.e., a structure with two or more layers).

The wiring member 71 includes a busbar portion 711 and finger portions 712. Each finger portion 712 has one of the ends thereof connected to the busbar portion 711.

The wiring member 72 includes a busbar portion 721 and finger portions 722 and 723. Each finger portion 722 has one of the ends thereof connected to the busbar portion 721. Each finger portion 723 has one of the ends thereof connected to the busbar portion 721. The finger portions 722 and 723 are connected to the busbar portion 721 on the opposite sides of the busbar portion 721.

The wiring member 73 includes a busbar portion 731 and finger portions 732 and 733. Each finger portion 732 has one of the ends thereof connected to the busbar portion 731. Each finger portion 733 has one of the ends thereof connected to the busbar portion 731. The finger portions 732 and 733 are connected to the busbar portion 731 on the opposite sides of the busbar portion 731.

The wiring member 74 includes a busbar portion 741 and finger portions 742 and 743. Each finger portion 742 has one of the ends thereof connected to the busbar portion 741. Each finger portion 743 has one of the ends thereof connected to the busbar portion 741. The finger portions 742 and 743 are connected to the busbar portion 741 on the opposite sides of the busbar portion 741.

The wiring member 75 includes a busbar portion 751 and finger portions 752 and 753. The group of finger portions 752 is arranged adjacent to the group of finger portions 753 as traced along the length of the busbar portion 751. All the finger portions 752 and 753 have one of the ends thereof connected to the busbar portion 751 on the same side of the busbar portion 751.

The wiring member 76 includes a busbar portion 761 and finger portions 762 and 763. Each finger portion 762 has one of the ends thereof connected to the busbar portion 761. Each finger portion 763 has one of the ends thereof connected to the busbar portion 761. The finger portions 762 and 763 are connected to the busbar portion 761 on the opposite sides of the busbar portion 761.

The wiring member 77 includes a busbar portion 771 and finger portions 772 and 773. Each finger portion 772 has one of the ends thereof connected to the busbar portion 771. Each finger portion 773 has one of the ends thereof connected to the busbar portion 771. The finger portions 772 and 773 are connected to the busbar portion 771 on the opposite sides of the busbar portion 771.

The wiring member 78 includes a busbar portion 781 and finger portions 782 and 783. Each finger portion 782 has one of the ends thereof connected to the busbar portion 781. Each finger portion 783 has one of the ends thereof connected to the busbar portion 781. The finger portions 782 and 783 are connected to the busbar portion 781 on the opposite sides of the busbar portion 781.

The wiring member 79 includes a busbar portion 791 and finger portions 792 and 793. The group of finger portions 792 is arranged adjacent to the group of finger portions 793 as traced along the length of the busbar portion 791. All the finger portions 792 and 793 have one of the ends thereof connected to the busbar portion 791 on the same side of the busbar portion 791.

The wiring member 80 includes a busbar portion 801 and finger portions 802 and 803. Each finger portion 802 has one of the ends thereof connected to the busbar portion 801. Each finger portion 803 has one of the ends thereof connected to the busbar portion 801. The finger portions 802 and 803 are connected to the busbar portion 801 on the opposite sides of the busbar portion 801.

The wiring member 81 includes a busbar portion 811 and finger portions 812 and 813. Each finger portion 812 has one of the ends thereof connected to the busbar portion 811. Each finger portion 813 has one of the ends thereof connected to the busbar portion 811. The finger portions 812 and 813 are connected to the busbar portion 811 on the opposite sides of the busbar portion 811.

The wiring member 82 includes a busbar portion 821 and finger portions 822 and 823. Each finger portion 822 has one of the ends thereof connected to the busbar portion 821. Each finger portion 823 has one of the ends thereof connected to the busbar portion 821. The finger portions 822 and 823 are connected to the busbar portion 821 on the opposite sides of the busbar portion 821.

The wiring member 83 includes a busbar portion 831 and finger portions 832 and 833. The group of finger portions 832 is arranged adjacent to the group of finger portions 833 as traced along the length of the busbar portion 831. All the finger portions 832 and 833 have one of the ends thereof connected to the busbar portion 831 on the same side of the busbar portion 831.

The wiring member 84 includes a busbar portion 841 and finger portions 842 and 843. Each finger portion 842 has one of the ends thereof connected to the busbar portion 841. Each finger portion 843 has one of the ends thereof connected to the busbar portion 841. The finger portions 842 and 843 are connected to the busbar portion 841 on the opposite sides of the busbar portion 841.

The wiring member 85 includes a busbar portion 851 and finger portions 852 and 853. Each finger portion 852 has one of the ends thereof connected to the busbar portion 851. Each finger portion 853 has one of the ends thereof connected to the busbar portion 851. The finger portions 852 and 853 are connected to the busbar portion 851 on the opposite sides of the busbar portion 851.

The wiring member 86 includes a busbar portion 861 and finger portions 862 and 863. Each finger portion 862 has one of the ends thereof connected to the busbar portion 861. Each finger portion 863 has one of the ends thereof connected to the busbar portion 861. The finger portions 862 and 863 are connected to the busbar portion 861 on the opposite sides of the busbar portion 861.

The wiring member 87 includes a busbar portion 871 and finger portions 872. Each finger portion 872 has one of the ends thereof connected to the busbar portion 871.

The wiring member 71 is disposed on the insulating base member 710 such that the finger portions 712 thereof alternate with the finger portions 722 of the wiring member 72.

The wiring member 72 is disposed on the insulating base member 710 such that the finger portions 722 thereof alternate with the finger portions 712 of the wiring member 71 and the finger portions 723 thereof alternate with the finger portions 732 of the wiring member 73.

The wiring member 73 is disposed on the insulating base member 710 such that the finger portions 732 thereof alternate with the finger portions 723 of the wiring member 72 and the finger portions 733 thereof alternate with the finger portions 742 of the wiring member 74.

The wiring member 74 is disposed on the insulating base member 710 such that the finger portions 742 thereof alternate with the finger portions 733 of the wiring member 73 and the finger portions 743 thereof alternate with the finger portions 752 of the wiring member 75.

The wiring member 75 is disposed on the insulating base member 710 such that the finger portions 752 thereof alternate with the finger portions 743 of the wiring member 74 and the finger portions 753 thereof alternate with the finger portions 762 of the wiring member 76.

The wiring member 76 is disposed on the insulating base member 710 such that the finger portions 762 thereof alternate with the finger portions 753 of the wiring member 75 and the finger portions 763 thereof alternate with the finger portions 772 of the wiring member 77.

The wiring member 77 is disposed on the insulating base member 710 such that the finger portions 772 thereof alternate with the finger portions 763 of the wiring member 76 and the finger portions 773 thereof alternate with the finger portions 782 of the wiring member 78.

The wiring member 78 is disposed on the insulating base member 710 such that the finger portions 782 thereof alternate with the finger portions 773 of the wiring member 77 and the finger portions 783 thereof alternate with the finger portions 792 of the wiring member 79.

The wiring member 79 is disposed on the insulating base member 710 such that the finger portions 792 thereof alternate with the finger portions 783 of the wiring member 78 and the finger portions 793 thereof alternate with the finger portions 802 of the wiring member 80.

The wiring member 80 is disposed on the insulating base member 710 such that the finger portions 802 thereof alternate with the finger portions 793 of the wiring member 79 and the finger portions 803 thereof alternate with the finger portions 812 of the wiring member 81.

The wiring member 81 is disposed on the insulating base member 710 such that the finger portions 812 thereof alternate with the finger portions 803 of the wiring member 80 and the finger portions 813 thereof alternate with the finger portions 822 of the wiring member 82.

The wiring member 82 is disposed on the insulating base member 710 such that the finger portions 822 thereof alternate with the finger portions 813 of the wiring member 81 and the finger portions 823 thereof alternate with the finger portions 832 of the wiring member 83.

The wiring member 83 is disposed on the insulating base member 710 such that the finger portions 832 thereof alternate with the finger portions 823 of the wiring member 82 and the finger portions 833 thereof alternate with the finger portions 842 of the wiring member 84.

The wiring member 84 is disposed on the insulating base member 710 such that the finger portions 842 thereof alternate with the finger portions 833 of the wiring member 83 and the finger portions 843 thereof alternate with the finger portions 852 of the wiring member 85.

The wiring member 85 is disposed on the insulating base member 710 such that the finger portions 852 thereof alternate with the finger portions 843 of the wiring member 84 and the finger portions 853 thereof alternate with the finger portions 862 of the wiring member 86.

The wiring member 86 is disposed on the insulating base member 710 such that the finger portions 862 thereof alternate with the finger portions 853 of the wiring member 85 and the finger portions 863 thereof alternate with the finger portions 872 of the wiring member 87.

The wiring member 87 is disposed on the insulating base member 710 such that the finger portions 872 thereof alternate with the finger portions 863 of the wiring member 86.

The wiring members 71 to 87 only need to be electrically conductive. Any electrically conductive material may be used without particular limitation. The wiring members 71 to 87 are composed of, for example, Cu, Al, Ag, or an alloy of primarily these metals.

The thickness of the wiring members 71 to 87 is not particularly limited and preferably, for example, from 10 µm to 80 µm, inclusive. The wire resistance is excessive if the thickness is less than 10 µm. If the thickness exceeds 80 µm, the silicon substrate could bend due to the difference in thermal expansion coefficient between the silicon substrate and the wiring members 71 to 87 when heat is applied in attaching photovoltaic devices 10 to the wiring members 71 to 87.

The shape of the insulating base member 710 is by no means limited to the shape shown in FIG. 16 and may be modified in a suitable manner. Alternatively, a conductive material such as Ni, Au, Pt, Pd, Sn, In, or ITO may be provided on parts of the surfaces of the wiring members 71 to 87. This conductive material such as Ni provided on parts of the surfaces of the wiring members 71 to 87 is intended to form good electrical contacts between the wiring members 71 to 87 and the electrodes 6 and 7 of the photovoltaic devices 10 and to improve weather resistance of the wiring members 71 to 87. Additionally, the wiring members 71 to 87 may have either a single-layered structure or a multi-layered structure.

A photovoltaic device 10 is disposed in a region REG1 such that the electrodes 6 are connected to the finger portions 712 of the wiring member 71 and also that the electrodes 7 are connected to the finger portions 722 of the wiring member 72. Another photovoltaic device 10 is disposed in a region REG2 such that the electrodes 6 are connected to the finger portions 723 of the wiring member 72 and also that the electrodes 7 are connected to the finger portions 732 of the wiring member 73. Other photovoltaic devices 10 are disposed on the wiring members 73 to 87 in a similar manner. Hence, sixteen photovoltaic devices 10 are connected in series.

The electrodes 6 and 7 of the photovoltaic devices 10 are connected to the associated wiring members 71 to 87 using an adhesive. The adhesive may be composed of, for example, at least one adhesive material selected from the group consisting of soldering resin, solder, conductive adhesive, thermosetting Ag paste, low-temperature-curing copper paste, ACF (anisotropic conductive film), ACP (anisotropic conductive paste), and NCP (non-conductive paste). The soldering resin may be, for example, TCAP-5401-27 manufactured by Tamura Kaken Corporation. The non-conductive paste may be, for example, epoxy resin, acrylic resin, or urethane resin and may also be a thermosetting or photocuring resin. The conductive adhesive may be, for example, soldering particles containing either one or both of tin and bismuth. More preferably, the conductive adhesive is an alloy of tin and, bismuth, indium, silver, or a like metal. These compositions lower the solder's melting point, thereby allowing the adhesion process to be performed at low temperature.

If the photovoltaic device 10 includes the protective film 8 on the n-type amorphous semiconductor strips 4, the p-type amorphous semiconductor strips 5, and the electrodes 6 and 7, it follows that two inorganic insulating films are provided on different underlayers: one on the electrodes 6 and 7 and the other on the n-type amorphous semiconductor strips 4 and the p-type amorphous semiconductor strips 5. In the photovoltaic device 10, inorganic insulating films are provided contiguously on different underlayers. When the inorganic insulating films on different underlayers of this structure experience a thermal history, the inorganic insulating films could come off or develop another defect due to a difference in thermal expansion coefficient between the underlayers. Therefore, thermal processes are preferably performed at low temperature, especially, at temperatures not higher than 200° C. Therefore, a thermosetting Ag paste, low-temperature-curing copper paste, anisotropic conductive film, and anisotropic conductive paste that cure at low temperature and that can electrically be attached are particularly preferred.

The photovoltaic devices 10, as provided on the wiring sheet 70, are sandwiched between ethylene vinyl acetate resin (EVA resin) on a glass substrate and EVA resin on a PET film. The EVA resin on the glass substrate is then compressed onto the photovoltaic devices 10 by vacuum compression using a laminator, whereas the EVA resin on the PET film is heated to 125° C. for curing while being compressed to the photovoltaic devices 10. This procedure seals the photovoltaic devices 10, as provided on the wiring sheet 70, in the EVA resin cured between the glass substrate and the PET film, which completes the manufacture of the solar cell module.

Embodiment 2

FIG. 17 is a cross-sectional view of a photovoltaic device in accordance with the present embodiment. As shown in FIG. 17, a photovoltaic device 10A of the present embodiment differs from Embodiment 1 in that a texture structure is formed not only on the light-receiving face of the semiconductor substrate 1, but also on the back face of the semiconductor substrate 1. The following will describe the photovoltaic device 10A, especially the difference thereof from Embodiment 1.

The photovoltaic device 10A is manufactured as in the following. First, a step is performed that is similar to the step shown in (a) of FIG. 5 of Embodiment 1. Then, both faces of the semiconductor substrate 1' is subjected to anisotropic etching using an etchant similar to the one used in Embodiment 1. This procedure completes the fabrication of a semiconductor substrate 1A in which a pyramidal texture structure is formed on both faces of the semiconductor substrate 1' (see (a) of FIG. 18).

After the manufacture of the semiconductor substrate 1A, steps are sequentially performed that are similar to the step shown in (c) of FIG. 5 and the step shown in (d) of FIG. 6 of Embodiment 1, to form an antireflective film 2 including an amorphous semiconductor layer 11 and a silicon nitride film 12 on the light-receiving face of the semiconductor substrate 1A and to form a passivation film 3 on the back face of the semiconductor substrate 1A (see (b) of FIG. 18).

After forming the antireflective film 2 and the passivation film 3, steps are sequentially performed that are similar to the step shown in (e) of FIG. 6 to the step shown in (m) of FIG. 9 of Embodiment 1, to fabricate the photovoltaic device 10A shown in FIG. 17.

Since a texture structure is formed on the back face of the semiconductor substrate 1A in the present embodiment, the passivation film 3 is also processed to have an irregular surface. If the shadow mask 40 is placed over such a passivation film 3, the gaps between the shadow mask 40 and the passivation film 3 are larger than in Embodiment 1 as shown in FIG. 19, which makes it more likely that the dopant gas flows into the gaps between the shadow mask 40 and the passivation film 3. Therefore, the shadow mask used in step (g) may have openings that are adjusted in accordance with the shape and size of the texture such that the angle of inclination is steeper in the reduced-thickness regions of the p-type amorphous semiconductor strips than in the reduced-thickness regions of the n-type amorphous semiconductor strips.

In the present embodiment, a texture structure is formed not only on the light-receiving face of the semiconductor substrate 1, but also on the back face of the semiconductor substrate 1 as detailed here. That enables the semiconductor substrate 1 to admit incoming light efficiently. The additional texture structure on the back face increases surface area and decreases contact resistance. To form a texture structure only on the light-receiving face, the face on which no texture structure is to be formed needs to be protected in anisotropic etching. In contrast, if a texture structure is to be formed on both faces, there is no need to protect the faces of the semiconductor substrate 1, which reduces the number of manufacturing steps.

Embodiment 3

The semiconductor substrate 1 of the photovoltaic device 10 in accordance with Embodiment 1 described above is composed of an n-type crystalline silicon. Therefore, if the width of the p-type amorphous semiconductor strips 5 is increased over Embodiment 1 so that the p-type amorphous semiconductor strips 5 occupy a larger area, conversion efficiency will be further improved. However, if the intervals of the openings 40a of the shadow mask 40 used to form the p-type amorphous semiconductor strips 5 are narrowed to increase the width of the p-type amorphous semiconductor strips 5, the shadow mask 40 can be twisted or warped, and the p-type amorphous semiconductor strips cannot be formed at appropriate positions. The present embodiment will describe a structure in which the width of the openings 40a of the shadow mask 40 is increased over the photovoltaic device 10 of Embodiment 1, the p-type amorphous semiconductor strips are still formed at appropriate positions at a predetermined distance from the n-type amorphous semiconductor strips 4, and conversion efficiency is therefore improved.

FIG. 20 is a schematic plan view of a photovoltaic device in accordance with the present embodiment as viewed from the back side thereof. FIG. 21A is a schematic cross-sectional view of a photovoltaic device 10B shown in FIG. 20, taken along line III-III. FIG. 21B is a schematic cross-sectional view of the photovoltaic device 10B shown in FIG. 20, taken along line IV-IV. FIGS. 20, 21A, and 21B do not show the electrodes 6 and 7 and the protective film 8.

Referring to FIG. 20, the photovoltaic device 10B in accordance with the present embodiment includes n-type amorphous semiconductor strips 4 each formed in a single stretch along the Y-axis and p-type amorphous semiconductor strips 5A arranged in rows each constituted by a plurality of p-type amorphous semiconductor strips 5A spaced apart from each other along the Y-axis. The photovoltaic device 10B differs from the photovoltaic device 10 of Embodiment 1 in that the p-type amorphous semiconductor strips 5A are arranged in rows each constituted by a plurality of p-type amorphous semiconductor strips 5A spaced apart from each other along the Y-axis.

Referring to FIG. 21A, the reduced-thickness regions of the p-type amorphous semiconductor strip 5A have a steeper angle of inclination than the reduced-thickness regions of the n-type amorphous semiconductor strip 4 as traced along the direction in which the n-type amorphous semiconductor strip 4 lies adjacent to the p-type amorphous semiconductor strip 5A (the X-axis direction). Furthermore, the p-type amorphous semiconductor strips 5A, as shown in FIG. 21B, have reduced-thickness regions that have an angle of inclination similar to the angle of inclination in FIG. 21A as traced along the direction in which the p-type amorphous semiconductor strips 5A lie adjacent to each other (as traced along the Y-axis direction). In other words, in this example, the p-type amorphous semiconductor strips 5A each have reduced-thickness regions where the angle of inclination is steeper than that of the reduced-thickness regions of the n-type amorphous semiconductor strips 4 as traced along both the X- and Y-axis directions.

The photovoltaic device 10B is manufactured as in the following. First, the step shown in (a) of FIG. 5 to the step shown in (f) of FIG. 6 of Embodiment 1 are sequentially performed to form the n-type amorphous semiconductor strips 4 on the passivation film 3 as in Embodiment 1.

Then, after forming the n-type amorphous semiconductor strips 4, a shadow mask 401 shown in (a) of FIG. 22, instead of the shadow mask 40, is placed over the passivation film 3 and the n-type amorphous semiconductor strips 4 in the step shown in (g) of FIG. 7.

Portion (b) of FIG. 22 is a cross-sectional view of the shadow mask 401 taken along line V-V in (a) of FIG. 22, and (c) of FIG. 22 is a cross-sectional view of the shadow mask 401 taken along line VI-VI in (a) of FIG. 22. As shown in (b) of FIG. 22, the shadow mask 401 has openings 401a that have a trapezoidal cross-section in the X-axis direction with the opening width in the X-axis direction being narrower on the bottom side of the shadow mask 401 than on the top side (W32<W31). Additionally, as shown in (c) of FIG. 22, the openings 401a of the shadow mask 401 have a trapezoidal cross-section in the Y-axis direction with the opening width in the Y-axis direction being narrower on the bottom side of the shadow mask 401 than on the top side face (W42<W41).

After the shadow mask 401 is placed, a step is performed that is similar to the step shown in (h) of FIG. 7. The step deposits p-type amorphous silicon on areas of the passivation film 3 that are not covered with the shadow mask 401, thereby forming the p-type amorphous semiconductor strips 5A with reduced-thickness regions as traced along the X- and Y-axis directions on the passivation film 3. The reduced-thickness regions of the p-type amorphous semiconductor strips 5A formed using the shadow mask 401 have a steeper angle of inclination than the reduced-thickness regions of the n-type amorphous semiconductor strips 4.

After forming the p-type amorphous semiconductor strips 5A, the step shown in (i) of FIG. 7 to the step shown in (m) of FIG. 9 of Embodiment 1 are performed to form the electrodes 6 and 7 on the n-type amorphous semiconductor strips 4 and the p-type amorphous semiconductor strips 5A respectively and to form the protective film 8 covering the gap regions G and parts of the electrodes 6 and 7.

The openings 401a of the shadow mask 401 are arranged at predetermined intervals Gp as traced along the Y-axis direction. Therefore, if the width of the p-type amorphous semiconductor strips is increased in the X-axis direction over Embodiment 1, the inter-opening regions of the shadow mask 401 that are between the openings 401a as viewed in the Y-axis direction still contribute to the strength of the shadow mask 401. Therefore, the shadow mask 401, when placed over the passivation film 3 and the n-type amorphous semiconductor strips 4, is less likely to be twisted or warped, thereby enabling the p-type amorphous semiconductor strips 5A to be formed at appropriate positions.

In addition, the shadow mask 401 has inter-opening regions between the openings 401a not only as viewed in the X-axis direction, but also as viewed in the Y-axis direction. Therefore, if the openings 401a had a rectangular cross-section in the Y-axis direction, boron (B) would flow into areas not under the openings 401a in the Y-axis direction and hence diffuse into the passivation film 3. In the present embodiment, the openings 401a of the shadow mask 401 have a trapezoidal cross-section not only in the X-axis direction, but also in the Y-axis direction. Therefore, the p-type amorphous semiconductor strips 5A are formed with reduced-thickness regions where the angle of inclination is steeper than that of the reduced-thickness regions of the n-type amorphous semiconductor strips 4 as traced along both the X- and Y-axis directions. Hence, boron (B) is restrained from diffusing into the inter-opening regions between the openings 401*a* as viewed in the Y-axis direction, and conversion efficiency is improved.

Embodiment 4

FIG. 23 is a schematic plan view of a photovoltaic device in accordance with the present embodiment as viewed from the back side thereof. FIG. 23 does not show the electrodes 6 and 7 and the protective film 8.

Referring to FIG. 23, a photovoltaic device 10C in accordance with the present embodiment differs from the photovoltaic device 10B of Embodiment 3 in that the photovoltaic device 10C includes n-type amorphous semiconductor strips 4A arranged in rows each constituted by a plurality of n-type amorphous semiconductor strips 4A spaced apart from each other along the Y-axis direction. The n-type amorphous semiconductor strips 4A have, as traced along both the X- and Y-axis directions, reduced-thickness regions that are similar to the reduced-thickness regions of the n-type amorphous semiconductor strips 4 of Embodiment 1.

The photovoltaic device 10C is manufactured as in the following. First, the step shown in (a) of FIG. 5 to the step shown in (d) of FIG. 6 are sequentially performed. Then, in the step shown in (e) of FIG. 6, a shadow mask 301 shown in FIG. 24, instead of the shadow mask 30, is placed over the passivation film 3.

Referring to FIG. 24, the shadow mask 301 has openings 301*a* arranged in the X- and Y-axis directions. The openings 301 are separated by predetermined intervals Gn as traced along the Y-axis direction. The openings 301*a* of the shadow mask 301 have a rectangular cross-section in both the X- and Y-axis directions, as in Embodiment 1.

After the shadow mask 301 is placed, the step shown in (f) of FIG. 6 of Embodiment 1 is performed to form the n-type amorphous semiconductor strips 4A on the passivation film 3. Then, in the step shown in (g) of FIG. 7, a same shadow mask 401 similar to the one used in Embodiment 3 is placed, and the steps shown in (h) and (i) of FIG. 7 are sequentially performed to form the p-type amorphous semiconductor strips 5A on the passivation film 3.

Thereafter, the step shown in (j) of FIG. 8 to the step shown in (m) of FIG. 9 are performed to form the electrodes 6 and 7 on the n-type amorphous semiconductor strips 4A and the p-type amorphous semiconductor strips 5A respectively and to form the protective film 8 covering the gap regions G and parts of the electrodes 6 and 7, which completes the manufacture of the photovoltaic device 10C.

Since the shadow mask 301 in accordance with the present embodiment has the openings 301*a* which are in each row spaced apart in the Y-axis direction as detailed here, the inter-opening regions between the openings 301*a* as viewed in the Y-axis direction increases the strength of the shadow mask 301 over the shadow mask 30. As mentioned earlier, the shadow mask 401 also has an increased strength because of the inter-opening regions between the openings 401*a* as viewed in the Y-axis direction. This structure narrows the gap regions between the n- and p-type amorphous semiconductor strips, further improving the conversion efficiency of the photovoltaic device 10C.

Embodiment 5

FIG. 25 is a schematic plan view of a photovoltaic device in accordance with the present embodiment as viewed from the back side thereof. FIG. 25 does not show the electrodes 6 and 7 and the protective film 8.

As shown in FIG. 25, a photovoltaic device 10D in accordance with the present embodiment differs from the photovoltaic device 10C in accordance with Embodiment 4 in that the former includes n-type amorphous semiconductor strips 4A and p-type amorphous semiconductor strips 5A arranged alternately as viewed along both the X-axis direction and the Y-axis direction.

The n-type amorphous semiconductor strips 4A each have a reduced-thickness region as traced along the X-axis direction and along the Y-axis direction similarly to the n-type amorphous semiconductor strips 4 of Embodiment 1. The p-type amorphous semiconductor strips 5A each have a reduced-thickness region as traced along the X-axis direction and along the Y-axis direction similarly to the p-type amorphous semiconductor strips 5 of Embodiment 1. In other words, the p-type amorphous semiconductor strips 5A have reduced-thickness regions where the angle of inclination is steeper, as traced along the X- and Y-axis directions, than the angle of inclination of the reduced-thickness regions of the n-type amorphous semiconductor strips 4.

The photovoltaic device 10D is manufactured as in the following. First, the step shown in (a) of FIG. 5 to the step shown in (d) of FIG. 6 are sequentially performed. After that, in the step shown in (e) of FIG. 6, a shadow mask 302 shown in FIG. 26A, instead of the shadow mask 30, is placed over the passivation film 3. As shown in FIG. 26A, the shadow mask 302 has a plurality of openings 302*a* arranged in a staggered array configuration so that the openings 302*a* are not adjacent to each other as traced along the X-axis direction and the Y-axis direction. The openings 302*a* are of a rectangular cross-section in the X-axis direction and the Y-axis direction.

After the shadow mask 302 is placed, the step shown in (f) of FIG. 6 is performed to form the n-type amorphous semiconductor strips 4A on the passivation film 3. Then, in the step shown in (g) of FIG. 7, a shadow mask 402 shown in FIG. 26B, instead of the shadow mask 40, is placed over the passivation film 3. As shown in FIG. 26B, the shadow mask 402 has a plurality of openings 402*a* arranged in a staggered array configuration in the X-axis direction and the Y-axis direction. The openings 402*a* are of a trapezoidal cross-section in the X-axis direction and the Y-axis direction.

Then, after the shadow mask 402 is placed, the steps shown in (h) and (i) of FIG. 7 are sequentially performed to form the p-type amorphous semiconductor strips 5A on the passivation film 3.

After the p-type amorphous semiconductor strips 5A are formed, the step shown in (j) of FIG. 8 to the step shown in (m) of FIG. 9 are performed to form the electrodes 6 and 7 on the n-type amorphous semiconductor strips 4A and the p-type amorphous semiconductor strips 5A respectively and to form the protective film 8 covering the gap regions G and parts of the electrodes 6 and 7, which completes the manufacture of the photovoltaic device 10D.

The shadow mask 302 in accordance with the present embodiment has the openings 302*a* arranged in a staggered array configuration as detailed here. The shadow mask 402 also has the openings 402*a* arranged in a staggered array configuration similarly to the shadow mask 302. In other words, in the present embodiment, no openings are arranged directly adjacent to each other unlike in the shadow masks 301 and 401 of Embodiment 4. Therefore, the load borne by the shadow masks 302 and 402 is spread broadly when compared with Embodiment 4, which increases the strength of the shadow masks 302 and 402. That further narrows the gap regions between the n- and p-type amorphous semiconductor strips over Embodiment 3 and hence further improves the conversion efficiency of the photovoltaic device 10D. In addition, since the photovoltaic device 10D has the n-type amorphous semiconductor strips 4A and the p-type amorphous semiconductor strips 5A arranged in a staggered array configuration, carriers move in the X-axis direction and the Y-axis direction, and the conversion efficiency is further improved over Embodiment 3.

Embodiment 6

FIG. 27 is a schematic diagram showing a configuration of a photovoltaic module including photovoltaic devices in accordance with the present embodiment. Referring to FIG. 27, a photovoltaic module 1000 includes a plurality of photovoltaic devices 1001, an enclosure 1002, and output terminals 1003 and 1004.

The photovoltaic devices 1001 are arranged in an array and connected in series. The photovoltaic devices 1001 may be connected in parallel or connected in series and in parallel, instead of being connected in series.

Each photovoltaic device 1001 is one of the photovoltaic devices 10, 10A, 10B, 10C, and 10D.

The enclosure 1002 is composed of a weatherproof enclosure and houses the photovoltaic devices 1001. The enclosure 1002 includes, for example, a transparent base member (e.g., glass) provided so as to face the light-receiving faces of the photovoltaic devices 1001, a back-face base member (e.g., glass or resin sheet) provided so as to face the back faces (opposite the light-receiving faces) of the photovoltaic devices 1001, and a sealing member (e.g., EVA) sealing the gaps between the transparent base member and the back-face base member.

The output terminal 1003 is connected to one of the photovoltaic devices 1001 connected in series that is located at one end of the series.

The output terminal 1004 is connected to one of the photovoltaic devices 1001 connected in series that is located at the other end of the series.

As mentioned earlier, the photovoltaic devices 10, 10A, 10B, 10C, and 10D suppress boron (B) diffusion and have excellent passivation and conversion efficiency.

Therefore, the photovoltaic module 1000 improves passivation and conversion efficiency.

The number of the photovoltaic devices 1001 contained in the photovoltaic module 1000 is equal to any integer greater than 1.

The photovoltaic module in accordance with Embodiment 6 is by no means limited to the configuration shown in FIG. 27 and may have any configuration so long as one the photovoltaic devices 10, 10A, 10B, 10C, and 10D is used.

Embodiment 7

FIG. 28 is a schematic diagram showing a configuration of a solar power generation system including photovoltaic devices in accordance with the present embodiment.

Referring to FIG. 28, a solar power generation system 1100 includes a photovoltaic module array 1101, a junction box 1102, a power conditioner 1103, a distribution board 1104, and a power meter 1105.

The junction box 1102 is connected to the photovoltaic module array 1101. The power conditioner 1103 is connected to the junction box 1102. The distribution board 1104 is connected to the power conditioner 1103 and an electric device 1110. The power meter 1105 is connected to the distribution board 1104 and a grid interconnection.

The photovoltaic module array 1101 converts sunlight to electricity to generate DC power and supplies the generated DC power to the junction box 1102.

The junction box 1102 receives the DC power generated by the photovoltaic module array 1101 and supplies the received DC power to the power conditioner 1103.

The power conditioner 1103 converts the DC power received from the junction box 1102 to AC power and supplies the resulting AC power to the distribution board 1104.

The distribution board 1104 supplies the AC power received from the power conditioner 1103 and/or the commercial power received via the power meter 1105 to the electric device 1110. If the AC power received from the power conditioner 1103 is larger than the power consumption of the electric device 1110, the distribution board 1104 supplies the residual AC power to the grid interconnection via the power meter 1105.

The power meter 1105 measures the amount of power that is directed from the grid interconnection to the distribution board 1104 and measures the amount of power that is directed from the distribution board 1104 to the grid interconnection.

FIG. 29 is a schematic diagram showing a configuration of the photovoltaic module array 1101 shown in FIG. 28.

Referring to FIG. 29, the photovoltaic module array 1101 includes a plurality of photovoltaic modules 1120 and output terminals 1121 and 1122.

The photovoltaic modules 1120 form an array and are connected in series. The photovoltaic modules 1120 may be connected in parallel or connected in series and in parallel, instead of being connected in series. Each photovoltaic module 1120 is constituted by the photovoltaic module 1000 shown in FIG. 27.

The output terminal 1121 is connected to one of the photovoltaic modules 1120 connected in series that is located at one end of the series.

The output terminal 1122 is connected to one of the photovoltaic modules 1120 connected in series that is located at the other end of the series.

The number of the photovoltaic modules 1120 contained in the photovoltaic module array 1101 is equal to any integer greater than 1.

The operation of the solar power generation system 1100 will be now described. The photovoltaic module array 1101 converts sunlight to electricity to generate DC power and supplies the generated DC power to the power conditioner 1103 via the junction box 1102.

The power conditioner 1103 converts the DC power received from the photovoltaic module array 1101 to AC power and supplies the resulting AC power to the distribution board 1104.

If the AC power received from the power conditioner 1103 is greater than or equal to the power consumption of the electric device 1110, the distribution board 1104 supplies the AC power received from the power conditioner 1103 to the electric device 1110. Then, the distribution board 1104 supplies the residual AC power to the grid interconnection via the power meter 1105.

If the AC power received from the power conditioner 1103 is less than the power consumption of the electric device 1110, the distribution board 1104 supplies the AC power received from the grid interconnection and the AC power received from the power conditioner 1103 to the electric device 1110.

As mentioned earlier, the solar power generation system 1100 includes any one of the photovoltaic devices 10, 10A, 10B, 10C, and 10D which have excellent passivation and conversion efficiency.

Therefore, the solar power generation system 1100 has improved passivation and conversion efficiency.

FIG. 30 is a schematic diagram showing a configuration of another solar power generation system including photovoltaic devices in accordance with the present embodiment.

The solar power generation system including photovoltaic devices in accordance with the present embodiment may be a solar power generation system 1100A shown in FIG. 30.

Referring to FIG. 30, the solar power generation system 1100A is the same as the solar power generation system 1100 shown in FIG. 28, except that the solar power generation system 1100A additionally includes a storage battery 1106.

The storage battery 1106 is connected to the power conditioner 1103.

In the solar power generation system 1100A, the power conditioner 1103 either partially or totally converts the DC power received from the junction box 1102 in a suitable manner for storage of power in the storage battery 1106.

The power conditioner 1103 otherwise operates in the same manner as in the solar power generation system 1100.

The storage battery 1106 stores the DC power received from the power conditioner 1103. The storage battery 1106 also supplies the stored power to the power conditioner 1103 in accordance with the changing power generation by the photovoltaic module array 1101 and/or the changing power consumption of the electric device 1110 in a suitable manner.

The solar power generation system 1100A includes the storage battery 1106 as detailed above. This makes it possible to reduce output variations caused by variations in solar radiation and to supply power accumulated in the storage battery 1106 to the electric device 1110 during the time periods in which there is no sunshine.

The storage battery 1106 may be incorporated into the power conditioner 1103.

The solar power generation system in the present embodiment is by no means limited to the configuration shown in FIGS. 28 and 29 or the configuration shown in FIGS. 29 and 30 and may have any configuration as far as one of the photovoltaic devices 10, 10A, 10B, 10C, and 10D is used.

Embodiment 8

FIG. 31 is a schematic diagram showing a configuration of a solar power generation system including photovoltaic devices in accordance with the present embodiment.

Referring to FIG. 31, a solar power generation system 1200 includes subsystems 1201 to 120n (n is an integer greater than 1), power conditioners 1211 to 121n, and a transformer 1221. The solar power generation system 1200 is of a greater scale than the solar power generation systems 1100 and 1100A shown respectively in FIGS. 28 and 30.

The power conditioners 1211 to 121n are connected to the respective subsystems 1201 to 120n.

The transformer 1221 is connected to the power conditioners 1211 to 121n and a grid interconnection.

Each subsystem 1201 to 120n is composed of module systems 1231 to 123j (j is an integer greater than 1).

Each module system 1231 to 123j includes photovoltaic module arrays 1301 to 130i (i is an integer greater than 1), junction boxes 1311 to 131i, and a power collection box 1321.

Each photovoltaic module array 1301 to 130i has the same configuration as the photovoltaic module array 1101 shown in FIG. 25.

The junction boxes 1311 to 131i are connected to the respective photovoltaic module arrays 1301 to 130i.

The power collection box 1321 is connected to the junction boxes 1311 to 131i. The j power collection boxes 1321 of the subsystem 1201 are connected to the power conditioner 1211. The j power collection boxes 1321 of the subsystem 1202 are connected to the power conditioner 1212. Other power collection boxes are connected to other power conditioners in a similar manner, and the j power collection boxes 1321 of the subsystem 120n are connected to the power conditioner 121n.

The i photovoltaic module arrays 1301 to 130i of the module system 1231 convert sunlight to electricity to generate DC power and supply the generated DC power to the power collection box 1321 via the respective junction boxes 1311 to 131i. The i photovoltaic module arrays 1301 to 130i of the module system 1232 convert sunlight to electricity to generate DC power and supply the generated DC power to the power collection box 1321 via the respective junction boxes 1311 to 131i. Other arrays operate in a similar manner, and the i photovoltaic module arrays 1301 to 130i of the module system 123j convert sunlight to electricity to generate DC power and supply the generated DC power to the power collection box 1321 via the respective junction boxes 1311 to 131i.

Then, the j power collection boxes 1321 of the subsystem 1201 supply their DC power to the power conditioner 1211.

In a similar manner, the j power collection boxes 1321 of the subsystem 1202 supply their DC power to the power conditioner 1212.

Other power collection boxes operate in a similar manner, and the j power collection boxes 1321 of the subsystem 120n supply their DC power to the power conditioner 121n.

The power conditioners 1211 to 121n change the DC power received from the respective subsystems 1201 to 120n to AC power and supply the resulting AC power to the transformer 1221.

The transformer 1221 receives AC power from the power conditioners 1211 to 121n, converts the voltage level of the received AC power, and supplies the resulting power to the grid interconnection.

As mentioned earlier, the solar power generation system 1200 includes any one of the photovoltaic devices 10, 10A, 10B, 10C, and 10D which have excellent.

Therefore, the solar power generation system 1200 has improved passivation and conversion efficiency.

FIG. 32 is a schematic diagram showing a configuration of another solar power generation system including photovoltaic devices in accordance with the present embodiment.

The solar power generation system including photovoltaic devices in accordance with the present embodiment may be a solar power generation system 1200A shown in FIG. 32.

Referring to FIG. 32, the solar power generation system 1200A is the same as the solar power generation system 1200 shown in FIG. 31, except that the solar power generation system 1200A additionally includes storage batteries 1241 to 124n.

The storage batteries 1241 to 124n are connected respectively to the power conditioners 1211 to 121n.

In the solar power generation system 1200A, the power conditioners 1211 to 121n convert the DC power received respectively from the subsystems 1201 to 120n to AC power and supply the resulting AC power to the transformer 1221. The power conditioners 1211 to 121n also convert the DC power received respectively from the subsystems 1201 to 120n in a suitable manner for storage of the resulting DC power in the respective storage batteries 1241 to 124n.

The storage batteries 1241 to 124n supply the stored power to the respective power conditioners 1211 to 121n in accordance with the DC power supplied from the subsystems 1201 to 120n respectively.

The solar power generation system 1200A includes the storage batteries 1241 to 124n as detailed above. This makes it possible to reduce output variations caused by variations in solar radiation and to supply power accumulated in the storage batteries 1241 to 124n to the transformer 1221 during the time periods in which there is no sunshine.

The storage batteries 1241 to 124n may be incorporated into the power conditioners 1211 to 121n respectively.

The solar power generation system of the present embodiment is by no means limited to the configuration shown in FIGS. 31 and 32 and may have any configuration as far as one of the photovoltaic devices 10, 10A, 10B, 10C, and 10D is used.

Furthermore, in the present embodiment, not all the photovoltaic devices in the solar power generation systems 1200 and 1200A need to be the photovoltaic devices 10, 10A, 10B, 10C, or 10D.

As such an example, all the photovoltaic devices in a subsystem (i.e., one of the subsystems 1201 to 120n) are the photovoltaic devices 10, 10A, 10B, 10C, or 10D, whereas some or all the photovoltaic devices in another subsystem (i.e., another one of the subsystems 1201 to 120n) are photovoltaic devices other than the photovoltaic devices 10, 10A, 10B, 10C, and 10D.

Variation Examples

The embodiments and examples disclosed herein are for illustrative purposes only in every respect and provide no basis for restrictive interpretations. The scope of the present invention is defined only by the claims and never bound by the embodiments or examples. Those modifications and variations that may lead to equivalents of claimed elements are all included within the scope of the invention.

(1) The embodiments described above disclosed configurations including the protective film 8. Alternatively, no protective film 8 may be provided.

(2) The embodiments described above disclosed methods whereby the p-type amorphous semiconductor strips 5 are formed after the n-type amorphous semiconductor strips 4 are formed. Alternatively, the n-type amorphous semiconductor strips 4 may be formed after the p-type amorphous semiconductor strips 5 are formed. With the n-type amorphous semiconductor strips 4 and the p-type amorphous semiconductor strips 5 formed in a reverse sequence, the p-type amorphous semiconductor strips 5 are still formed such that the angle of inclination is steeper in the reduced-thickness regions of the p-type amorphous semiconductor strips 5 than in the reduced-thickness regions of the n-type amorphous semiconductor strips 4, which suppresses boron (B) diffusion into gap regions and thereby improves conversion efficiency.

(3) The embodiments described above disclosed, as an example, that the angle of inclination is rendered steeper in the reduced-thickness regions of the p-type amorphous semiconductor strips than in the reduced-thickness regions of the n-type amorphous semiconductor strips, by forming the n-type amorphous semiconductor strips and the p-type amorphous semiconductor strips using shadow masks with openings that have different cross-sectional shapes and additionally by doing so under different conditions. Alternatively, for example, the openings of the shadow mask may have a rectangular cross-sectional shape both for the p-type amorphous semiconductor strips and for the n-type amorphous semiconductor strips, and only the conditions under which the n- and p-type amorphous semiconductor strips are formed may be changed such that the angle of inclination is steeper in the reduced-thickness regions of the p-type amorphous semiconductor strips than in the reduced-thickness regions of the n-type amorphous semiconductor strips.

INDUSTRIAL APPLICABILITY

This invention is applicable to photovoltaic devices and also to solar cell modules and solar power generation systems including photovoltaic devices.

The invention claimed is:

1. A photovoltaic device comprising:
a semiconductor substrate:
n-type amorphous semiconductor strips containing phosphorus as a dopant; and
p-type amorphous semiconductor strips containing boron as a dopant, the n- and p-type amorphous semiconductor strips being provided alternately on the semiconductor substrate as viewed along an in-plane direction of the semiconductor substrate, wherein:
each of the n-type amorphous semiconductor strips includes a reduced-thickness region on a face thereof adjacent to one of the p-type amorphous semiconductor strips;
each of the p-type amorphous semiconductor strips includes a reduced-thickness region on a face thereof adjacent to one of the n-type amorphous semiconductor strips;
the reduced-thickness region of one of the p-type amorphous semiconductor strips has a steeper angle of inclination than does the reduced-thickness region of one of the n-type amorphous semiconductor strips:
and the reduced-thickness region of one of the p-type amorphous semiconductor strips has a dopant concentration that is higher than a dopant concentration at a first point, where:
the first point is a point at which each of the n-type amorphous semiconductor strips and p-type semiconductor strips formed on the semiconductor substrate has a maximum thickness; a second point is either a point at which a rate of decrease of the thickness of each of the n-type amorphous semiconductor strips and p-type semiconductor strips, as traced along an in-plane direction of each of the n-type amorphous semiconductor strips and p-type semiconductor strips, changes from a first rate of decrease to a second rate of decrease that is larger than the first rate of decrease or a point at which a rate of change of the thickness of each of the n-type amorphous semiconductor strips and p-type semiconductor strips, as traced along the in-plane direction of each of the n-type amorphous semiconductor strips and p-type semiconductor strips, changes sign from negative to positive; and the reduced-thickness region is a region from the first point to the second point as traced along the in-plane direction of each of the n-type amorphous semiconductor strips and p-type semiconductor strips.

2. The photovoltaic device according to claim 1, wherein each of the n-type amorphous semiconductor strips is separated from each adjacent one of the p-type amorphous semiconductor strips by a distance of from 20 μm inclusive to 100 μm exclusive.

3. The photovoltaic device according to claim 1, wherein the n- and p-type amorphous semiconductor strips are provided on a textured surface of the semiconductor substrate.

4. The photovoltaic device according to claim 1, wherein each of the n- and p-type amorphous semiconductor strips is provided in a single stretch in a direction perpendicular to a direction in which the n- and p-type amorphous semiconductor strips tie adjacent to each other.

5. The photovoltaic device according to claim 1, wherein either the n-type amorphous semiconductor strips or the p-type amorphous semiconductor strips or both are disposed spaced apart in a direction perpendicular to a direction in which the n- and p-type amorphous semiconductor strips lie adjacent to each other.

6. The photovoltaic device according to claim 1, wherein the n- and p-type amorphous semiconductor strips are disposed alternately as viewed along two intersecting directions on the semiconductor substrate.

7. The photovoltaic device according to claim 1, further comprising an intrinsic amorphous semiconductor layer provided on and in contact with the semiconductor substrate.

8. The photovoltaic device according to claim 1, further comprising:
  first electrodes on the n-type amorphous semiconductor strips; and
  second electrodes on the p-type amorphous semiconductor strips,
  wherein:
  on each of the n-type amorphous semiconductor strips, each first electrode is in contact with at least a part of the reduced-thickness region of that n-type amorphous semiconductor strip; and
  on each of the p-type amorphous semiconductor strips, each second electrode is in contact with at least a part of the reduced-thickness region of that p-type amorphous semiconductor strip.

* * * * *